(12) United States Patent
Pehlke et al.

(10) Patent No.: US 6,545,541 B2
(45) Date of Patent: Apr. 8, 2003

(54) POWER AMPLIFIER EMBEDDED CELL BIAS DETECTION, METHODS OF DETECTING BIAS IN POWER AMPLIFIERS AND SYSTEMS UTILIZING EMBEDDED CELL BIAS DETECTION

(75) Inventors: David R. Pehlke, Chapel Hill, NC (US); James Whartenby, Hot Springs, AR (US)

(73) Assignee: Ericsson Inc., Research Triangle Park, NC (US)

( * ) Notice: Subject to any disclaimer, the term of this patent is extended or adjusted under 35 U.S.C. 154(b) by 46 days.

(21) Appl. No.: 09/867,103

(22) Filed: May 29, 2001

(65) Prior Publication Data

US 2002/0180533 A1 Dec. 5, 2002

(51) Int. Cl.$^7$ ................................................ H03F 3/04
(52) U.S. Cl. ........................ 330/296; 330/290; 330/298
(58) Field of Search ................................. 330/290, 296, 330/298

(56) References Cited

U.S. PATENT DOCUMENTS

| | | | |
|---|---|---|---|
| 4,023,113 A | * 5/1977 | Mathias | 330/107 |
| 4,096,444 A | * 6/1978 | Fellrath | 330/277 |
| 4,319,198 A | * 3/1982 | Sosin | 330/296 |
| 4,605,891 A | * 8/1986 | Wrathall | 323/277 |
| 4,912,430 A | * 3/1990 | Frank | 330/277 |
| 5,293,217 A | * 3/1994 | Sugawara | 250/559.08 |
| 5,361,403 A | 11/1994 | Dent | 455/74 |
| 5,423,074 A | 6/1995 | Dent | 455/74 |
| 5,423,078 A | 6/1995 | Epperson et al. | 455/89 |
| 5,568,088 A | 10/1996 | Dent et al. | 330/151 |
| 5,570,062 A | 10/1996 | Dent | 330/51 |
| 5,574,967 A | 11/1996 | Dent et al. | 455/12.1 |
| 5,631,604 A | 5/1997 | Dent et al. | 330/124 R |
| 5,638,024 A | 6/1997 | Dent et al. | 330/84 |
| 5,652,546 A | 7/1997 | Dent | 330/276 |
| 5,694,433 A | 12/1997 | Dent | 375/297 |
| 5,732,325 A | 3/1998 | Dent et al. | 455/13.3 |
| 5,739,712 A | 4/1998 | Fuji | 327/323 |
| 5,818,298 A | 10/1998 | Dent et al. | 335/10 |
| 5,842,140 A | 11/1998 | Dent et al. | 455/573 |
| 5,923,217 A | * 7/1999 | Durec | 330/296 |
| 5,930,128 A | 7/1999 | Dent | 363/43 |
| 5,933,766 A | 8/1999 | Dent | 455/103 |
| 6,025,754 A | * 2/2000 | Czora | 330/296 |
| 6,061,568 A | 5/2000 | Dent | 455/450 |
| 6,097,615 A | 8/2000 | Dent | 363/43 |
| 6,198,351 B1 | * 3/2001 | Winslow | 257/382 |
| 6,218,904 B1 | * 4/2001 | Panther | 330/296 |
| 6,233,440 B1 | * 5/2001 | Taylor | 330/296 |
| 6,268,772 B1 | * 7/2001 | Chen | 318/432 |
| 6,404,286 B2 | * 6/2002 | De Vrieze et al. | 330/290 |

* cited by examiner

Primary Examiner—Michael Tokar
Assistant Examiner—Khai Nguyen
(74) Attorney, Agent, or Firm—Myers Bigel Sibley & Sajovec, P.A.

(57) ABSTRACT

Embodiments of the present invention provide methods and systems for current sensing for an amplifier using an embedded cell. The embedded cell is a transistor cell from a plurality of transistor cells which is coupled to the other transistor cells so as to block DC current flow between the embedded cell and the other cells and allow AC current to flow between the embedded cell and the other cells. Power may be supplied to the embedded cell through a current sensing circuit, such as a resistor, which senses the DC current drawn by the embedded cell which reflects to the total DC current drawn by the by amplifier. Systems for bias control and for amplitude modulation utilizing embedded cells are also provided.

56 Claims, 16 Drawing Sheets

POWER AMPLIFIER EMBEDDED CELL BIAS DETECTION, METHODS OF DETECTING BIAS IN POWER AMPLIFIERS AND SYSTEMS UTILIZING EMBEDDED CELL BIAS DETECTION

BACKGROUND OF THE INVENTION

The present invention relates to power amplifiers and, in particular, to the detection of a bias level in power amplifiers.

In conventional wireless devices, power amplifiers in a given frequency band for a given communication standard are typically optimized to meet specifications for output power, gain, linearity, and attain a maximum efficiency given the previous constraints. The control of direct current (DC) quiescent current levels in power amplifiers for wireless devices may effect the control of gain, linearity, and low power efficiency in handset application. In addition, in Global Standard for Mobile Communications (GSM) applications, under radio frequency (RF) drive conditions the linear relationship between DC collector current and output RF voltage amplitude in saturated bipolar power amplifiers has been exploited by current sensing the collector current dynamically. Extensions of the use of saturated bipolar-based power amplifiers in architectures that enable linear amplification also may utilize current sensing of the DC current.

As seen in FIG. 1, conventionally, a series resistor 26 between the power supply and the power amplifier (PA) 20 detects the DC current levels. As is seen in FIG. 1, the DC voltage across the sense resistor 26 may be measured by operational amplifier 22 and fed back to a DC adjust circuit 24 which controls the DC bias of the PA 20. Inductor 28 may filter any alternating current (AC) component from the voltage and inductor 30 may be provided for matching purposes.

When a series sense resistor 26 is utilized to measure DC current levels, the sense resistor 26 may lead to dissipated power depending on the resistor value. Furthermore, the sense resistor 26 typically is a high accuracy low value resistor to preserve efficiency which may be expensive. For small resistor values, the degradation in efficiency may be small and can be quantified according to:

$$\eta^{w/Res}/\eta^{w/oRes}=1-I_{DC}R_{SENSE}/V_{DD}$$

where is the total $I_{DC}$ current, $R_{SENSE}$ is the value of the sense resistor between the PA 20 and the power supply (typically a battery in a wireless device), and $V_{DD}$ is the power supply voltage. For a typical application of a 1 Watt RF output and 50% efficiency, with $R_{SENSE}$=0.1 Ohm, and $V_{DD}$=3.4 V the degradation in efficiency will be 2%. For a larger, 1 Ohm, resistor, the efficiency degradation is closer to 18%.

In addition to the incremental loss in peak efficiency, the accuracy of the current sensing system may be sensitive to the exact value of the very small resistance. Such high accuracy, extremely small resistance values may be costly and/or difficult to manufacture.

It is the inventor's belief that previously a single transistor from a multi-transistor power amplifier was used to measure DC current for the amplifier by providing a separate power feed to the single transistor.

SUMMARY OF THE INVENTION

Embodiments of the present invention provide methods and systems for current sensing for an amplifier using an embedded cell. The embedded cell is a transistor cell from a plurality of transistor cells which is coupled to the other transistor cells so as to block DC current flow between the embedded cell and the other cells and allow AC current to flow between the embedded cell and the other cells. Power may be supplied to the embedded cell through a current sensing circuit, such as a resistor, which senses the DC current drawn by the embedded cell which reflects to the total DC current drawn by the by amplifier.

DETAILED DESCRIPTION OF THE INVENTION

Figure 1:
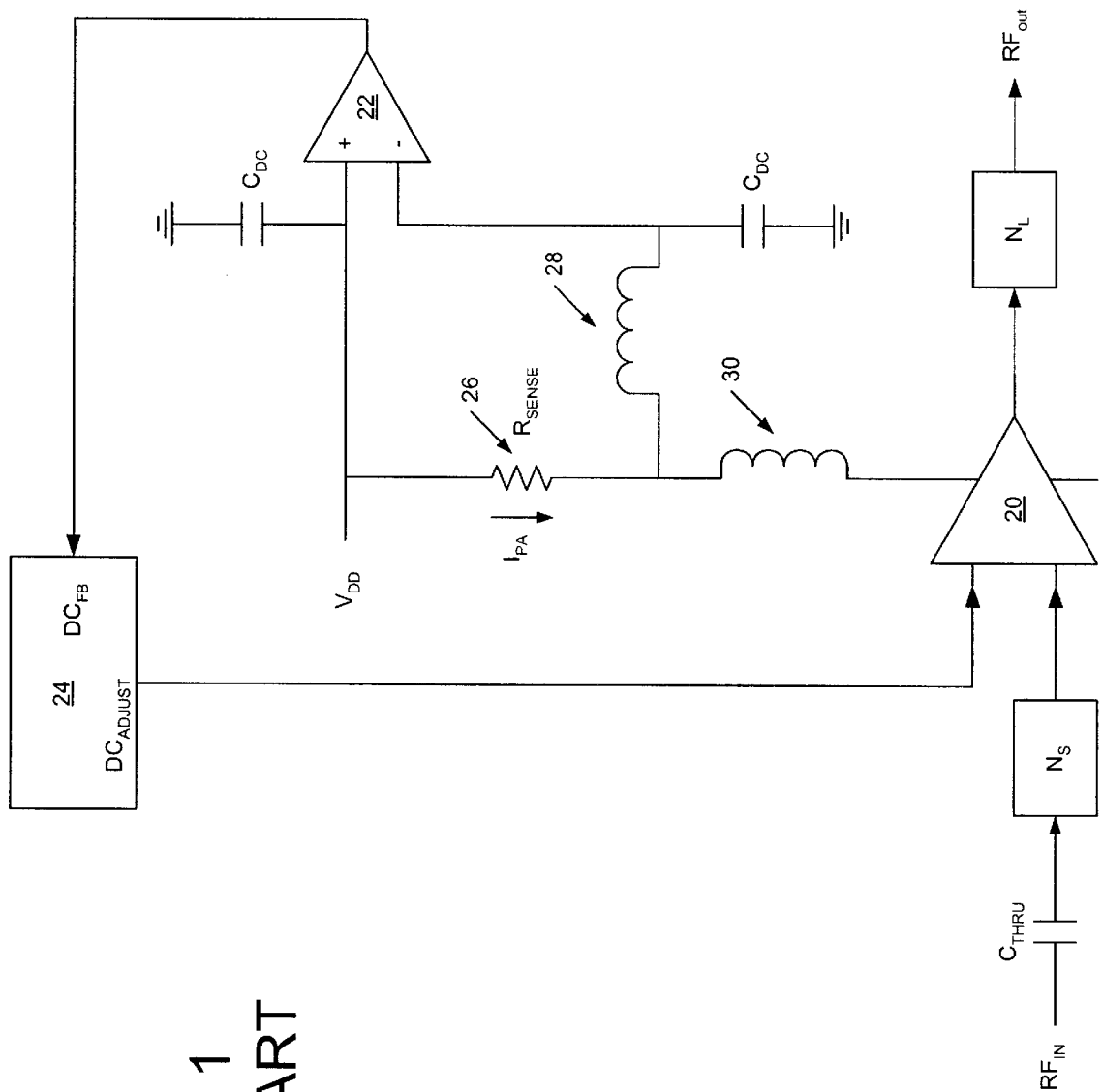
FIG. 1 is a schematic diagram illustrating conventional power amplifier bias detection.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the cope of the invention to those skilled in the art.

Like numbers refer to like elements throughout. Moreover, each embodiment can include its complementary conductivity embodiment as well.

Embodiments of the present invention may provide an Embedded Cell approach to detecting bias levels in power amplifiers using transistors having multiple cells or fingers, such as multiple output terminal transistors (e.g. a multi-collector bipolar transistor or a multi-drain field effect transistor) or multiple transistor cells. A reduction in DC currents of the power amplifier which are measured, may improve the DC power consumption of power amplifiers at low power levels. By using one or a few transistor cells of a power amplifier, which are referred to herein as "embedded cells", and AC coupling the embedded cell or cells to the other cells of the device to block DC currents between the embedded cell or cells and at least one of the other cells of the power amplifier, a large resistive load may be used to detect current flow for the embedded cell or cells. The embedded cell(s) may have the same dimensions as the other cells in the device or they may differ as long as the base-emitter turn-on voltage or threshold voltage is substantially the same as the other transistor cells in the device. By AC coupling the embedded cell(s) within the device the embedded cell(s) can see the precise input and output impedances at RF frequency that are seen by all the other cells, and the large resistance of the embedded cell's DC path may provide enough amplitude to reasonably detect and control the bias level, for example, in a temperature controlled feedback loop. Although the current density of the embedded cell may be the same as all the other cells of the device, the power lost due to the resistance may be minimal because the magnitude of the single fingers current is so small. Thus, it may be possible to obtain high efficiency and high sensitivity current detection so that minimal quiescent current can be achieved at low power even across process and temperature variations. Furthermore, by increasing the value of the sense resistor and reducing the current that flows through it, matched resistor architectures may be used in locking the DC current.

In particular embodiments of the present invention, an amplifier is provided having a plurality of transistor cells, each cell having a controlling terminal and controlled terminals. The controlling terminals of the plurality of transistor cells are commonly connected. A DC blocking circuit AC couples a controlled terminal of at least one of the plurality of transistor cells (embedded cell(s)) to a corresponding controlled terminal of the remainder of the plurality of transistor cells. A DC sensing circuit provides a DC current to the controlled terminal of the embedded cell(s).

The dimensions of the embedded cell(s) is preferably substantially the same as dimensions of remaining ones of the plurality of transistor cells. In any event, a first control voltage threshold associated with the embedded cell(s) is preferably substantially the same as a second control voltage threshold of the other transistor cells in the power amplifier. Furthermore, the plurality of transistor cells may be a transistor having a first common controlling terminal and a plurality of second controlled terminals and wherein the embedded cell(s) comprises at least one of the second controlled terminals. In such a case, the one(s) of the second controlled terminals may have substantially the same dimensions as dimensions of remaining ones of the controlled terminals. The plurality of transistor cells may also be a transistor and/or plurality of separate transistors having a common controlling terminal.

In further embodiments of the present invention, the DC sensing circuit is configured to sense a direct current provided to the embedded cell(s) which is proportional to a DC current supplied to the remaining transistor cells in the plurality of transistor cells. In particular embodiments of the present invention, the DC sensing circuit may include a resistor having a first terminal coupled to a first reference voltage and a second terminal coupled to the controlled terminal of the embedded transistor cell. Furthermore, the DC sensing circuit may also include an inductor having a first terminal coupled to the controlled terminal of the embedded transistor cell and a capacitor having a first terminal coupled to a second terminal of the inductor and a second terminal coupled to a second reference voltage. The DC current may be sensed by sensing a voltage between the first terminal of the resistor and the second terminal of the inductor. The inductor may have a value sufficiently large so as to not substantially change the DC current supplied to the controlled terminal of the embedded transistor cell of the plurality of transistor cells.

In still further embodiments of the present invention, the resistor has a value selected based on an expected DC current range so as to provide a voltage of sufficient magnitude to be sensed by a voltage sensing circuit for the expected DC current range.

The DC sensing circuit may also be a current mirror which mirrors the DC current provided to the controlled terminal of the embedded transistor cell.

In additional embodiments of the present invention, the DC blocking circuit includes a capacitor having a first terminal coupled to the controlled terminal of the embedded cell and a second terminal coupled to the corresponding controlled terminal of the remaining transistor cells of the plurality of transistor cells. The capacitor may be selected so as to have an impedance which is substantially less than an overall impedance of the corresponding controlled terminals of the remaining transistor cells in the plurality of transistor cells.

In particular embodiments of the present invention, a DC bias adjust circuit which controls a DC bias of the amplifier based on the sensed DC current of the DC sensing circuit may also be provided. The amplifier may also be an amplifier in a wireless communications device.

In still further embodiments of the present invention, a direct current bias in an amplifier having a plurality of transistor cells is sensed by coupling a controlled terminal of at least one of the transistor cells (embedded cell(s)) to controlled terminals of the other transistor cells to allow alternating current flow between the controlled terminal of the embedded cell(s) and the controlled terminals of the other transistor cells and to block DC current flow between the controlled terminal of the embedded cell(s) and the controlled terminals of the other transistor cells and sensing a DC current supplied to the embedded cell(s). The DC current supplied to the embedded cell(s) may be sensed by measuring a voltage value across a resistor in series with a supply voltage provided to the controlled terminal of the embedded cell(s).

In additional embodiments of the present invention, a controlled terminal of at least one of the transistor cells (embedded cell(s)) is capacitively coupled to the controlled terminal of at least one of the transistor cells of a plurality of other transistor cells.

Furthermore, a direct current bias of the amplifier may be adjusted based on the sensed DC current supplied to the embedded cell(s). In such embodiments, a direct current bias of the amplifier may be adjusted by determining a total current based on a ratio of a total number of transistor cells in the plurality of transistor cells to a number of transistor cells in the embedded cell(s) so as to determine a total direct current supplied to the amplifier.

In additional embodiments of the present invention, the amplifier with the embedded cell(s) is provided in combination with an amplitude modulation circuit utilizing voltage modulation with voltage feedback. In particular embodiments, the amplitude modulation circuit may be provided by an embedded cell voltage sensing circuit configured to sense a voltage provided to the at least one of the plurality of transistor cells and provide a voltage feedback signal. An embedded cell voltage regulating circuit is configured to modulate the voltage to the embedded cell(s) based on an amplitude modulation input signal and the voltage feedback signal. A transistor cells voltage regulating circuit configured to modulate a voltage provided to remaining ones of the plurality of transistor cells based on the amplitude modulation input signal and the voltage feedback signal.

In still further embodiments of the present invention, the amplifier is provided in combination with an amplitude modulation circuit utilizing voltage modulation with sensed current feedback. In such embodiments, the amplitude modulation circuit may be provided by an embedded cell current sensing circuit configured to sense a current provided to the at least one of the plurality of transistor cells and provide a current feedback signal. A voltage regulating circuit is configured to modulate a voltage provided to the embedded cell(s) and remaining ones of the plurality of transistor cells based on the amplitude modulation input signal and the current feedback signal.

In additional embodiments of the present invention, the amplifier is provided in combination with an amplitude modulation circuit utilizing current modulation with current detection and voltage buffering. In such embodiments, the amplitude modulation circuit may be provided by an embedded cell current sensing circuit configured to sense a current provided to the embedded cell(s) and provide a current feedback signal and an embedded cell voltage regulating circuit configured to modulate the voltage to the embedded cell(s) based on an amplitude modulation input signal and the current feedback signal. A voltage buffer circuit is configured to receive the current feedback signal and provide a buffered feedback signal and a transistor cells voltage regulating circuit is configured to modulate a voltage provided to remaining ones of the plurality of transistor cells based on the buffered feedback signal.

In yet further embodiments of the present invention, the amplifier is provided in combination with an amplitude modulation circuit utilizing current modulation with current detection and a voltage control loop. In such embodiments, the amplitude modulation circuit may be provided by an embedded cell current sensing circuit configured to sense a current provided to the embedded cell(s) and provide a current feedback signal. An embedded cell voltage regulating circuit is configured to modulate the voltage to the embedded cell(s) based on an amplitude modulation input signal and the current feedback signal. A voltage comparator is configured to compare a voltage provided to the embedded cell(s) and a voltage provided to remaining ones of the plurality of transistor cells and provide a comparison output. A transistor cells voltage regulating circuit is configured to provide the voltage to remaining ones of the plurality of transistor cells based on the comparison output.

In still further embodiments of the present invention, the amplifier is provided in combination with an amplitude modulation circuit utilizing current and voltage modulation. In such embodiments, the amplitude modulation circuit may be provided by an embedded cell current sensing circuit configured to sense a current provided to the embedded cell(s) and provide a current feedback signal. A transistor cells voltage sensing circuit is configured to sense a voltage provided to remaining ones of the plurality of transistor cells and provide a voltage feedback signal. An embedded cell voltage regulating circuit is configured to modulate a voltage provided to the embedded cell(s) based on an amplitude modulation input signal and the voltage feedback signal. A transistor cells voltage regulating circuit is configured to modulate the voltage provided to remaining ones of the plurality of transistor cells based on the amplitude modulated input and the current feedback signal.

Alternatively, the amplitude modulation circuit may be provided by an embedded cell voltage sensing circuit configured to sense a voltage provided to the embedded cell(s) and provide a voltage feedback signal. A transistor cells current sensing circuit configured to sense a current provided to remaining ones of the plurality of transistor cells and provide a current feedback signal. An embedded cell voltage regulating circuit configured to modulate the voltage provided to the embedded cell(s) based on an amplitude modulation input signal and the current feedback signal. A transistor cells voltage regulating circuit configured to modulate a voltage provided to remaining ones of the plurality of transistor cells based on the amplitude modulated input and the voltage feedback signal.

Figure 2:
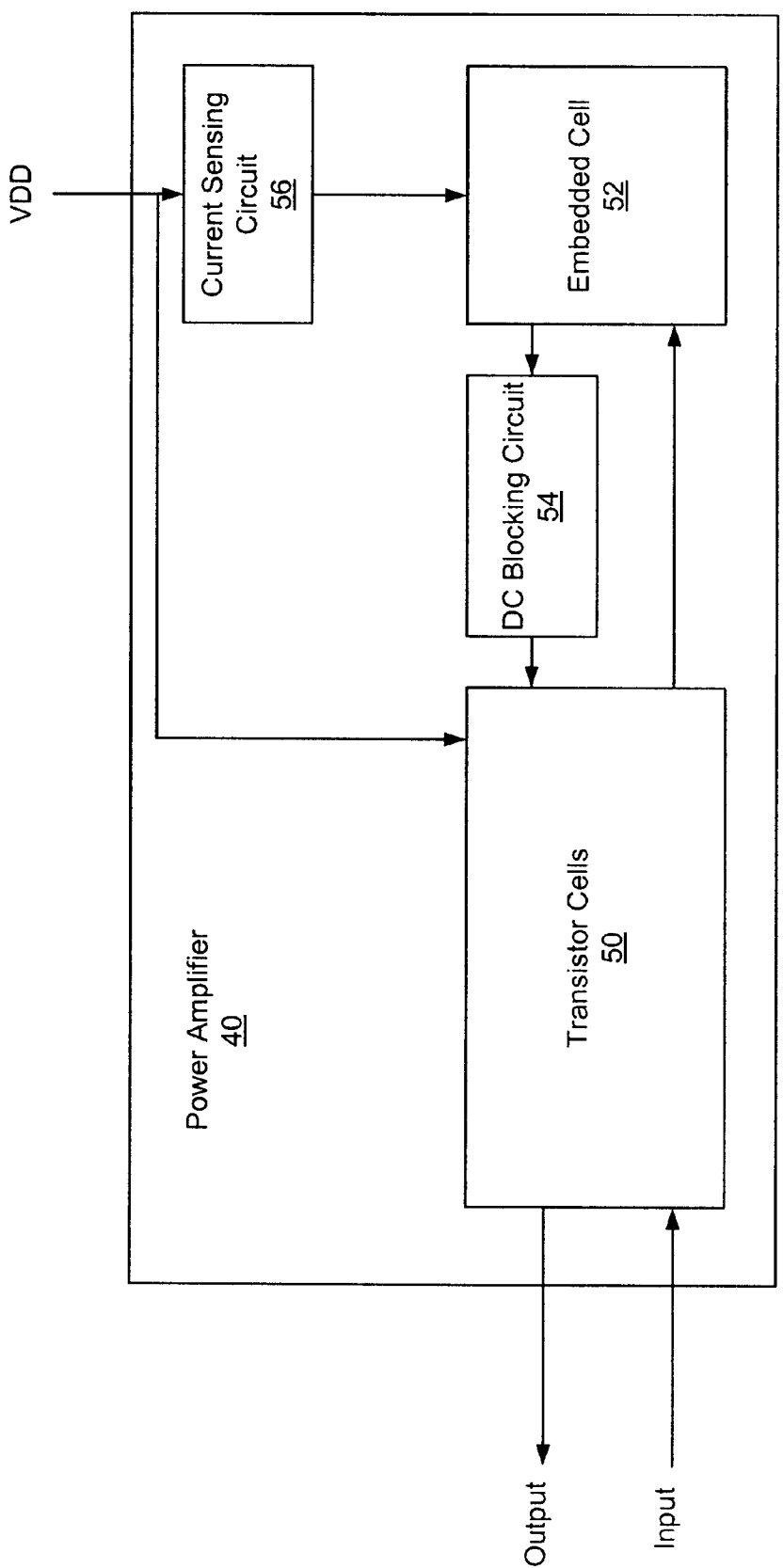
FIG. 2 is a block diagram of a power amplifier incorporating bias detection according to embodiments of the present invention.

FIG. 2 is a block diagram of a power amplifier 40 incorporating embodiments of the present invention. As seen in FIG. 2, the power amplifier 40 includes transistor cells 50 and an embedded cell 52. The transistor cells 50 may be one or more transistors, one or more transistor unit cells in a multi-cell transistor or may be one or more "fingers" in a multi-fingered device, such as a multiple emitter bipolar transistor, or combinations thereof. The embedded cell 52, may be one or more transistors, such a bipolar or field effect transistors, one or more transistor unit cells in a multi-cell transistor or may be one or more "fingers" in a multi-fingered device, such as a multiple emitter bipolar transistor or multiple drain field effect transistor, or combinations thereof. In particular embodiments of the present invention, the embedded cell 52 has the same dimensions as a transistor, transistor unit cell or finger.

The embedded cell 52 has a controlling input which is common with controlling inputs of the transistor cells 50. The embedded cell 52 also has a controlled output which is coupled to the corresponding controlled output of the transistor cells 50 by a DC blocking circuit 54 which prevents DC current from flowing between the embedded cell 52 and the transistor cells 50 while allowing AC current to flow between the embedded cell 52 and the transistor cells 50. In particular embodiments of the present invention, the DC blocking circuit 54 comprises a capacitor which capacitively couples the controlled output of the embedded cell 53 to the corresponding controlled output of the transistor cells 50. In such embodiments, the capacitor may be selected so as to not substantially alter the impedance seen by the embedded cell 52. The impedance may be considered substantially altered if the DC current drawn by the embedded cell 52 no longer represents the DC current drawn by the transistor cells 50 sufficiently accurately to allow the sensed current to be utilized for its intended purpose. For typical wireless devices, capacitor values provide a low impedance relative to the embedded cell output impedance and would, typically, be in the range of about 10 pF to about 20 pF at 850 MHz.

The supply voltage $V_{DD}$ is supplied to the transistor cells 50 directly or through a matching circuit, and is supplied to the embedded cell 52 through a current sensing circuit 56. The current sensing circuit 56 senses the DC current supplied to the embedded cell 52 which, because the embedded cell 52 is coupled to the transistor cells 50 so that is sees substantially the same impedance as the transistor cells 50, should be a scaled representation of the DC current of the transistor cells 50. In particular embodiments of the present invention, the current sensing circuit may include a sense resistor in series with the supply voltage to the embedded cell such that the voltage across the resistor represents the current drawn by the embedded cell 52. In further embodiments of the present invention, the AC component of the voltage across the sense resistor may be filtered out such that the measured voltage represents the DC current drawn by the embedded cell 52. The sense resistor may have a value selected based on an expected DC current range so as to provide a voltage of sufficient magnitude to be sensed by a voltage sensing circuit for the expected DC current range. The resistor may be an integrated resistor but may also be an external resistor. Use of an integrated resistor may provide for integration and high accuracy resistance matching because the resistance values may be inversely proportional to the current to be measure. Larger value resistance values may, typically, be more accurately manufactured as measure by the percentage deviation between resistors. For typical wireless devices, resistance values of from about 10 to about 100 ohms may be utilized.

Figure 3A:
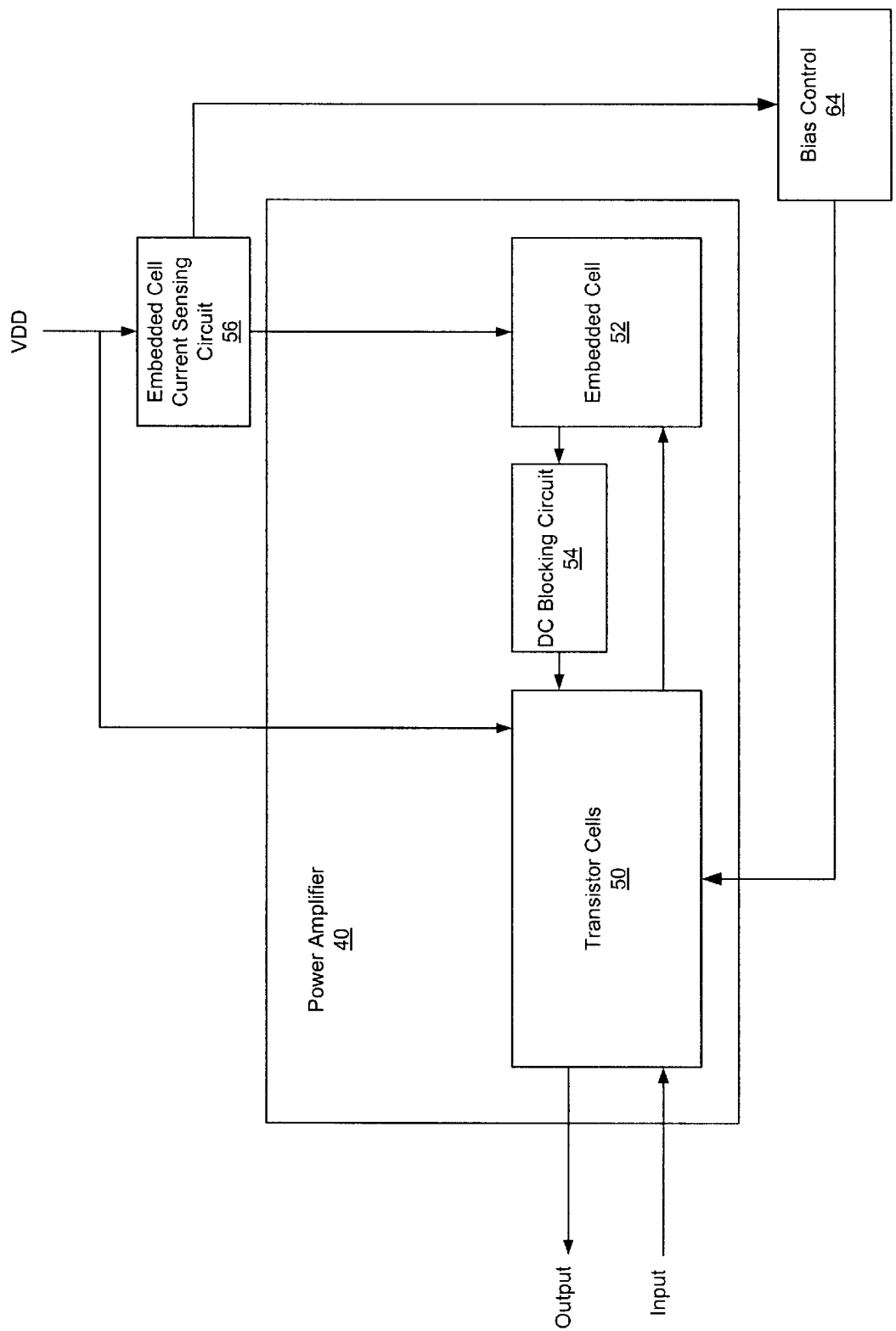
FIG. 3A is a block diagram illustrating a quiescent bias control system according to embodiments of the present invention.
Figure 3B:
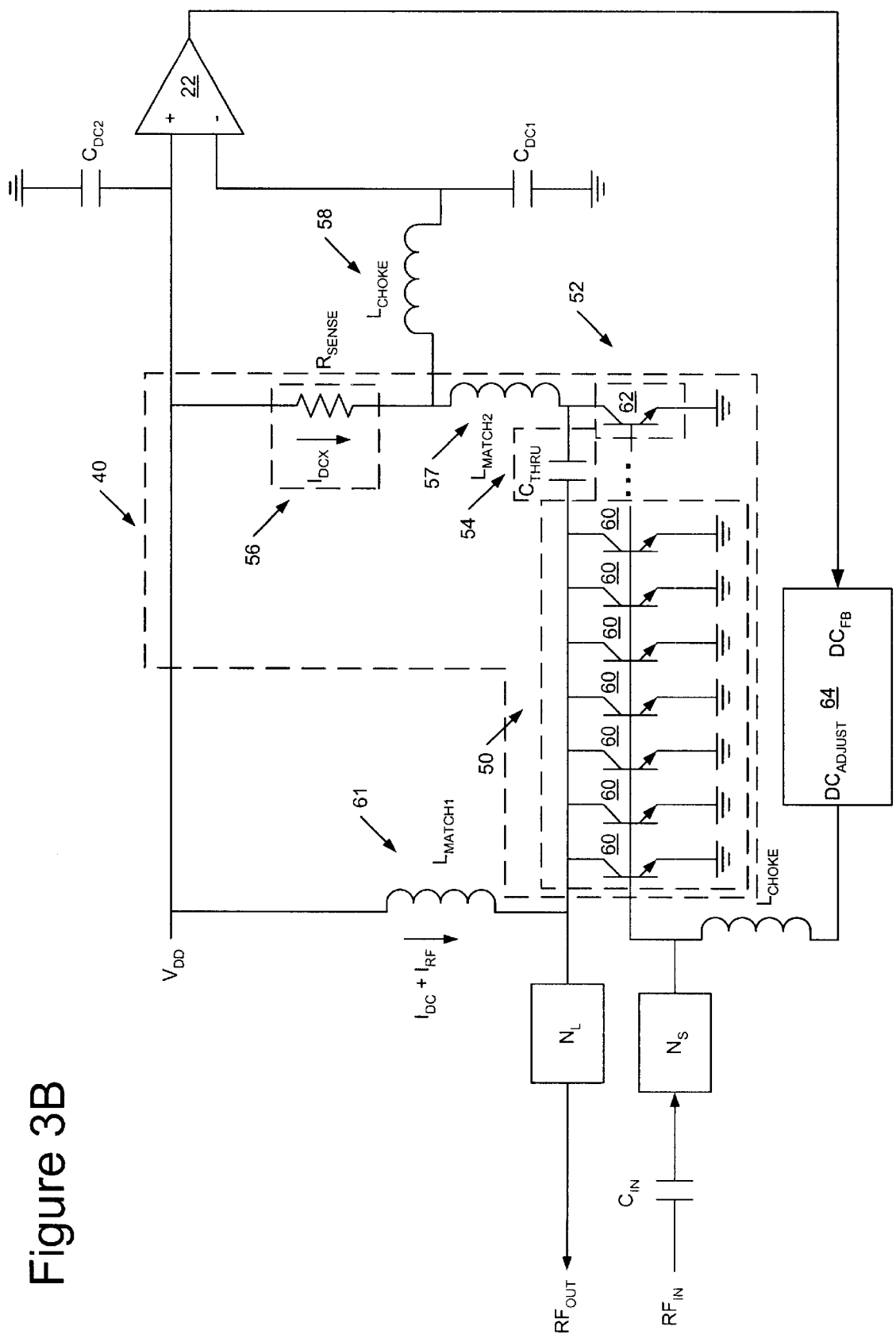
FIG. 3B is a schematic diagram illustrating a quiescent bias control system such as illustrated in FIG. 3A.

Embodiments of the present invention may be incorporated into, for example, a transmitter of a wireless device. In such embodiments, the power amplifier of the transmitter may be controlled by sensing the DC current of the embedded cell. Examples of such control are illustrated in FIGS. 3A and 3B which provide for the sensing of DC current and feedback to adjust (either through analog circuitry and/or DSP digital control) the bias of the PA. Such a use of current sensing may be used for the power control of saturated amplifiers through the control of bias of class C saturated amplifiers for the GSM and/or other standard.

As illustrated in FIG. 3A, the embedded cell current sensing circuit 56 senses the current provided to the embedded cell 52 and provides a feedback signal to the bias control circuit 64. The bias control circuit 64 controls the bias of the embedded cell 52 and the transistor cells 50 based on the feedback signal of the sensed current of the embedded cell 52.

In the particular embodiments of the present invention illustrated in FIG. 3B, the transistor cells 50 may be a plurality of transistors 60 which may be transistor unit cells, transistors or fingers of a multiple output transistor. The embedded cell 52 may be a transistor 62 which may be one or more transistor unit cells, transistors or fingers of the a multiple emitter bipolar transistor or multiple drain field effect transistor which, a turn-on voltage or threshold voltage which is substantially the same, and preferably exactly the same, as a turn-on or threshold voltage of the transistors 60. Preferably, the embedded cell 52 has substantially the same dimensions as one of the transistors 60. Both the transistors 60 and the transistor 62 have a controlling input, the base, and a controlled output, the collector. The controlled inputs of the transistors 60 and the transistor 62 are commonly connected. The controlled outputs of the transistors 60 are commonly connected and are coupled to the controlled output of the transistor 62 through the DC blocking circuit 54 which is provided by the capacitor $C_{THRU}$. The current sensing circuit 56 is provided as a resistor $R_{SENSE}$ which is connected in series between $V_{DD}$ and the controlled output terminal of the transistor 62.

As is further seen in FIG. 3B, an inductor 58 is provided to filter out the AC component of the current flowing through $R_{SENSE}$ such that the voltage differential measured by the operational amplifier 22 reflect the voltage across $R_{SENSE}$ as a result of the DC current $I_{DCX}$. The operational amplifier 22 amplifies the measured voltage differential across $R_{SENSE}$ and provides the amplified voltage to a bias adjust circuit 64. The inductance value for the inductor 58 may be selected to have a value sufficiently large so as to not substantially change the DC current supplied to the controlled terminal of the transistor 62. For typical wireless devices, inductor values of from about 10 to about 100 nH may be utilized.

The bias adjust circuit 64 may be a conventional bias adjust circuit modified to take into account that the current sensed by $R_{SENSE}$ is proportional to the total DC current drawn by the PA 40. For example, in a 100 finger device, the current sensed by a single finger would be $\frac{1}{100}$ the total current. Such a difference in current measurement may be taken into account by the bias adjust circuit 64 or a conventional bias adjust circuit may be utilized and the value of $R_{SENSE}$ selected such that the voltage differential across $R_{SENSE}$ would be the same as if the total current were sensed using conventional techniques. Thus, in the present example, the value of $R_{SENSE}$ could be made 100 times greater than the value of the sense resistor of the conventional techniques illustrated in FIG. 1 such that the voltage differential is the same across $R_{SENSE}$ as it would be across the sense resistor of FIG. 1.

As is further seen in FIG. 3B, the supply voltage may also be provided to the controlled output terminals of the transistors 60 through a matching inductor 61 and the sense resistor $R_{SENSE}$ is coupled to the controlled output terminals of the transistor 62 through the matching inductor 57. Similarly, the bias adjust current may be provided to the controlling terminals of the transistors 60 and the transistor 62 through a choke inductor $L_{CHOKE}$. Additionally, an RF input may be provided to the power amplifier 40 through the input capacitor $C_{IN}$ and the input network $N_S$. Finally, the output of the power amplifier may be provided to a load, such as an antenna for a transmitter, through a load network $N_L$. Filter capacitors $C_{DC1}$ and $C_{DC2}$ may also be provided as seen in FIG. 3B. Such techniques are conventional in the art and, therefore, need not be described further herein.

Figure 4A:
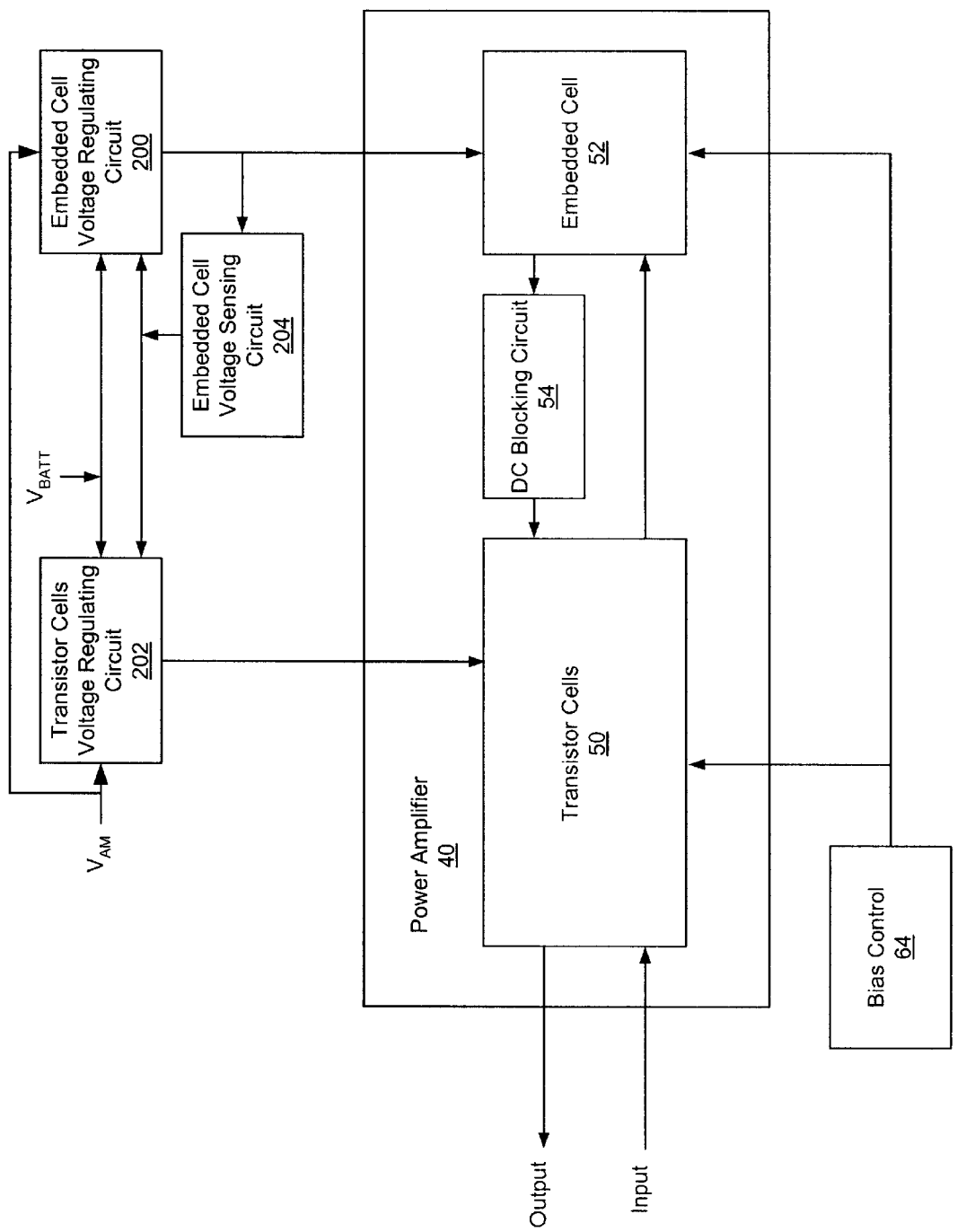
FIG. 4A is a block diagram illustrating a voltage modulation system according to embodiments of the present invention.

Further embodiments for amplitude modulation through the DC supply are illustrated in FIGS. 4A through 8C. Turning to FIG. 4A, AM restoration using voltage modulation with voltage feedback is illustrated. Systems such as illustrated in FIGS. 4A through 8C may provide higher open loop gain and linearity over conventional systems through the use of the embedded cell 52 as described herein.

As seen in FIG. 4A an embedded cell voltage regulating circuit 200 provides power to the embedded cell 52. The voltage supplied to the embedded cell 52 is sensed by an embedded cell voltage sensing circuit 204 and the sensed voltage is fed back to the embedded cell voltage regulating circuit 200 and to a transistor cells voltage regulating circuit 202. The transistor cells voltage regulating circuit 202 provides power to the transistor cells 50. The transistor cells voltage regulator 202 and the embedded cell voltage regulator 200 are modulated based on the input $V_{AM}$ and the sensed voltage fed back by the embedded cell voltage sensing circuit 204 such that the voltage provided to the transistor cells 50 is amplitude modulated. As described below, the voltage regulating circuits 200 and 202 may be provided by lossy/dissipative transistors.

Figure 4B:
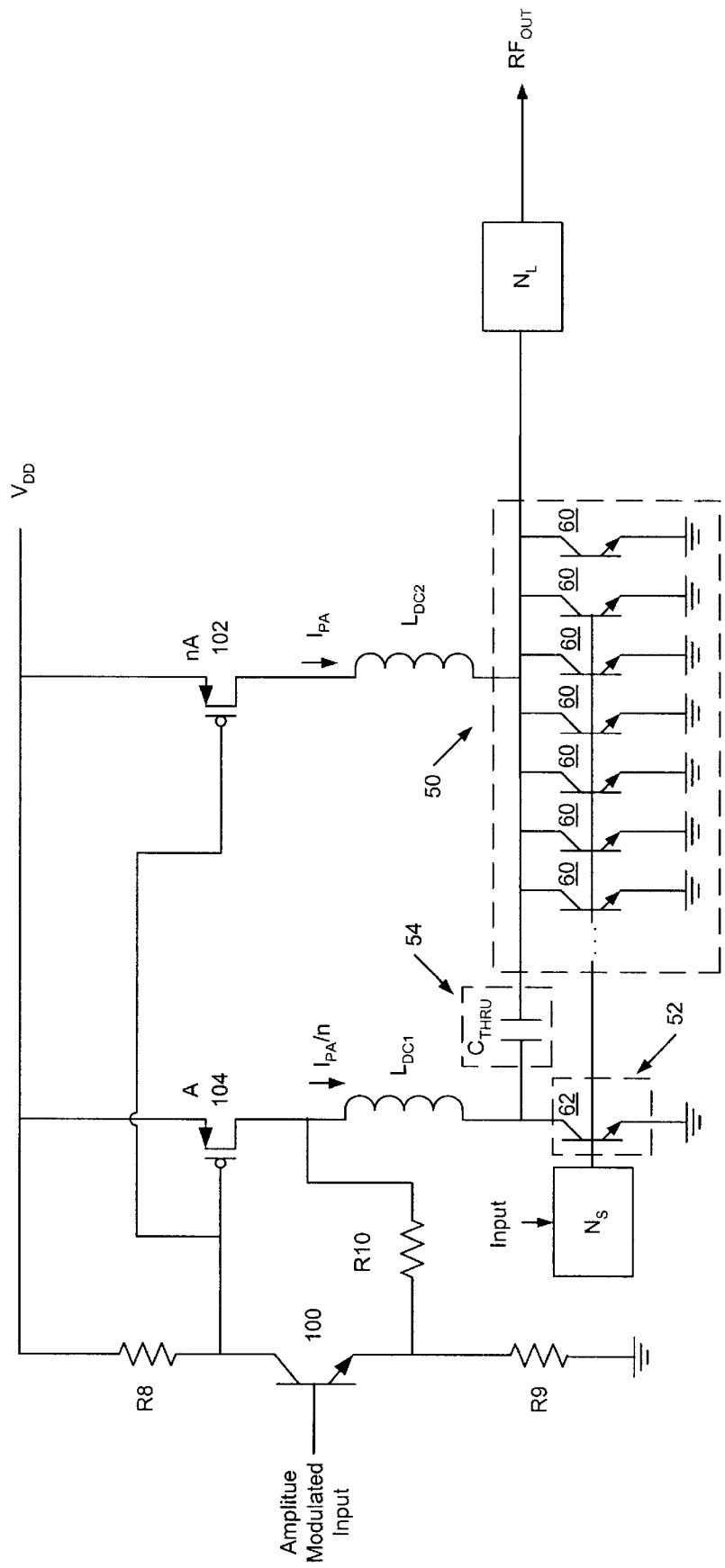
FIG. 4B is a schematic diagram illustrating a voltage modulation system such as illustrated in FIG. 4A.

Particular embodiments of the system of FIG. 4A are illustrated in FIG. 4B. As seen in FIG. 4B, the supply voltage to the transistor cells 50 is modulated by the amplitude modulated input to the transistor 100. The modulation is segmented into two portions, the first portion modulates the transistor 62 and is controlled by feedback generated by the voltage feedback through the resistor R10 and the larger portion modulates the transistor cells 50. The transistor 100 controls the current through the resistors R8 and R9, which may, for example, be 1000 and 100 ohms respectively, so as to provide a voltage to the transistors 102 and 104 which controls the power supplied to the transistors 50 and the transistor 62. As seen in FIG. 4B, the transistor 104 may have an area of A and the transistor 102 may have an area of nA such that the area of the transistor 102 is n times the area of the transistor 104. The transistor 104 is provided in series with the inductor $L_{DC1}$ which may act as a matching inductor or as a choke to block RF energy and serve to isolate the embedded cell sensing circuit. For a power amplifier including n transistors, the current through the transistor 104 will be 1/n the current through the transistor 102. Furthermore, the current through the transistor 102 is provided to the power amplifier through the matching inductor $L_{DC2}$ and is indicated as $I_{PA}$ and, therefore, the current through the inductor $L_{DC1}$ will be $I_{PA}/n$ such that the voltage across the inductor $L_{DC1}$ and the transistor 62, which is fed back to the transistor 100, reflects the current $I_{PA}$ provided to the power amplifier 50.

As is further seen in FIG. 4B, output terminal of the transistor 104 is operably coupled to the resistor RIO which provides feedback to the transistor 100. The resistor R10 may, for example, be 400 ohms. Thus, the voltage at the collector of the transistor 100 will be based on the voltage across the inductor $L_{DC1}$ and the transistor 62 which will be representative of the voltage provided to the transistors 50. By isolating the feedback across the higher output impedance of the smaller embedded cell transistor 62, the loop gain can be made greater and the feedback may be more effective in linearizing the output amplitude of the entire device.

Figure 5A:
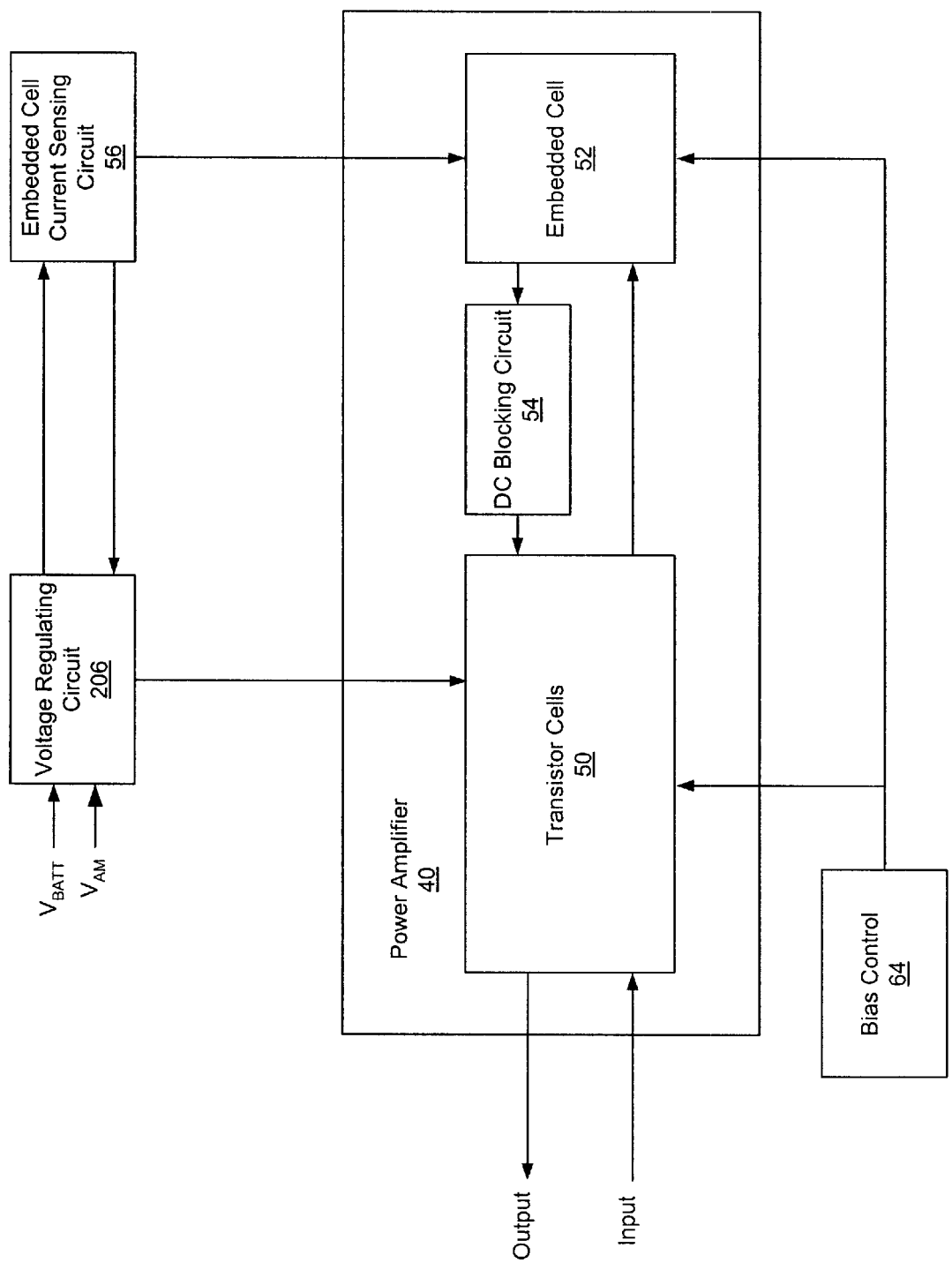
FIG. 5A is a block diagram illustrating a current modulation system according to embodiments of the present invention.

FIG. 5A illustrates a current modulation system utilizing the embedded cell 52. As seen in FIG. 5A a voltage regulating circuit 206 provides power to the transistor cells 50 and to the embedded cell 52 through an embedded cell current sensing circuit 56. The current supplied to the embedded cell 52 is sensed by the embedded cell current sensing circuit 56 and the sensed current is fed back to the voltage regulating circuit 206. The voltage regulating circuit 206 modulates the voltage provided to the transistor cells 50 based on the input $V_{AM}$ and the feedback signal from the embedded cell current sensing circuit 56 such that the current provided to the transistor cells 50 is amplitude modulated.

Figure 5B:
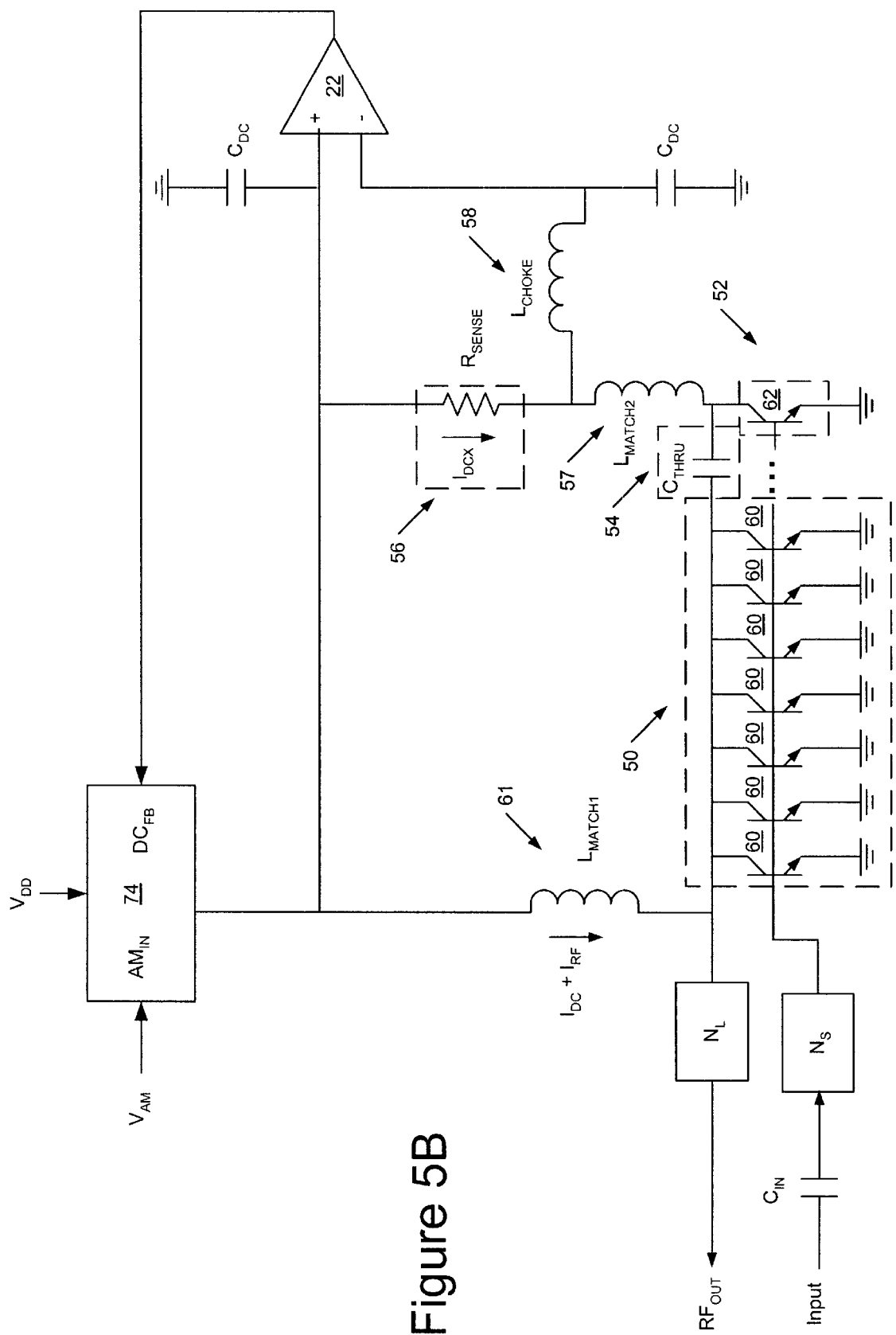
FIG. 5B is a schematic diagram illustrating a current modulation system such as illustrated in FIG. 5A.

FIG. 5B illustrates as system according to the block diagram of FIG. 5A where current sensing is used to adjust the DC supply (either in fixed steps, or to impose full envelope information of the amplitude modulation) to change the supply current and thereby modulate the amplitude of the PA output. The sensed DC current is fed back to a modulation circuit 74 which controls the voltage supplied to the PA 40 based on the voltage proportional to the DC current and an amplitude modulated input $V_{AM}$.

Figure 6A:
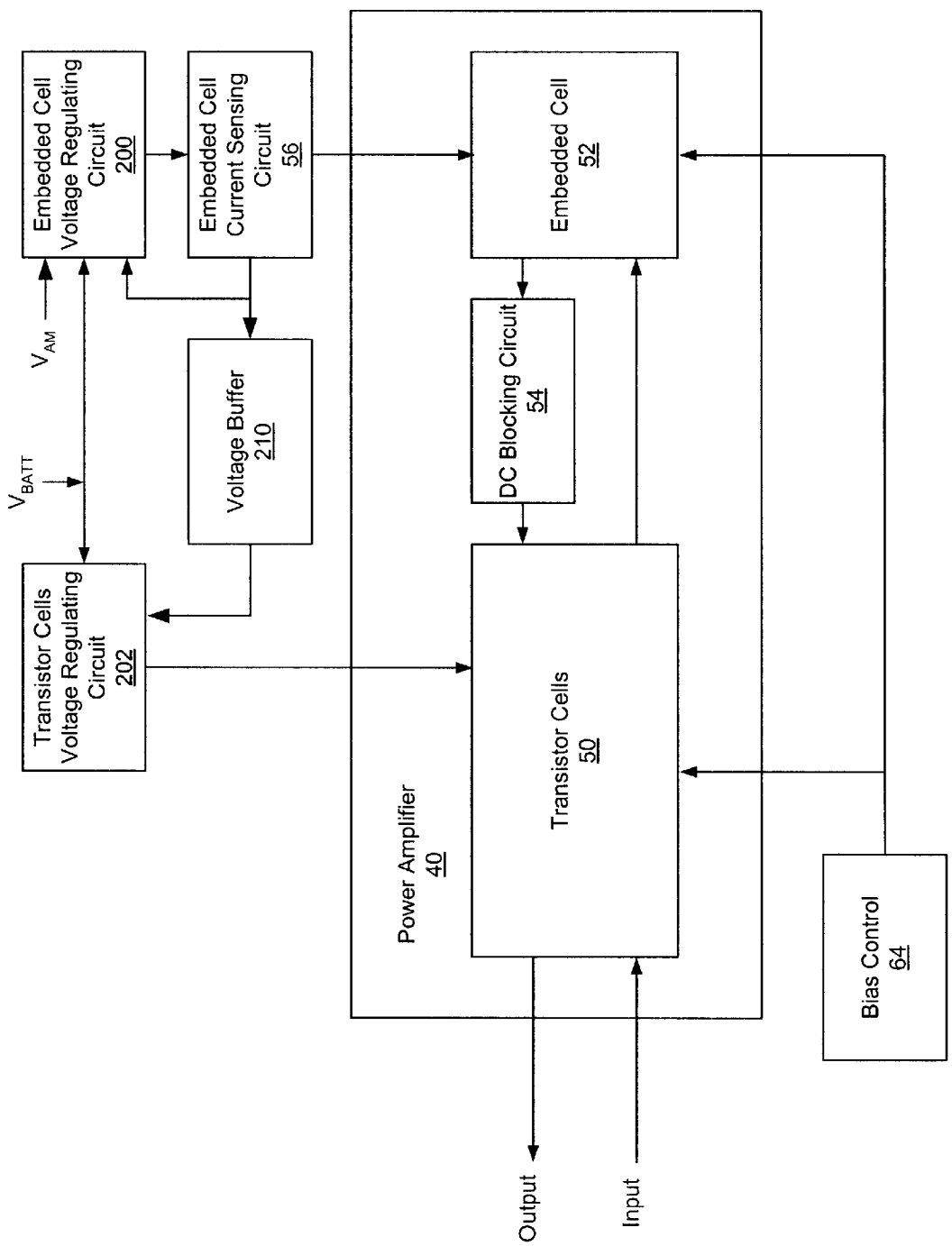
FIG. 6A is a block diagram illustrating further embodiments of a current modulation system according to embodiments of the present invention.

FIG. 6A illustrates a current modulation system utilizing the embedded cell 52 which may also provide improved bandwidth over conventional current modulation systems. As seen in FIG. 6A an embedded cell voltage regulating circuit 200 provides power to the embedded cell 52 through an embedded cell current sensing circuit 56. The current supplied to the embedded cell 52 is sensed by the embedded cell current sensing circuit 56 and the sensed current is fed back to the embedded cell voltage regulating circuit 200 and to a transistor cells voltage regulating circuit 202 through a voltage buffer 210. The embedded cell voltage regulating circuit 200 modulates the voltage provided to the embedded cell 52 based on the input $V_{AM}$ and the feedback signal from the embedded cell current sensing circuit 56. The transistor cells voltage regulating circuit 202 modulates the voltage provided to the transistor cells 50 based on the voltage buffered feedback signal from the embedded cell current sensing circuit 56 such that the current provided to the transistor cells 50 is amplitude modulated.

Figure 6B:
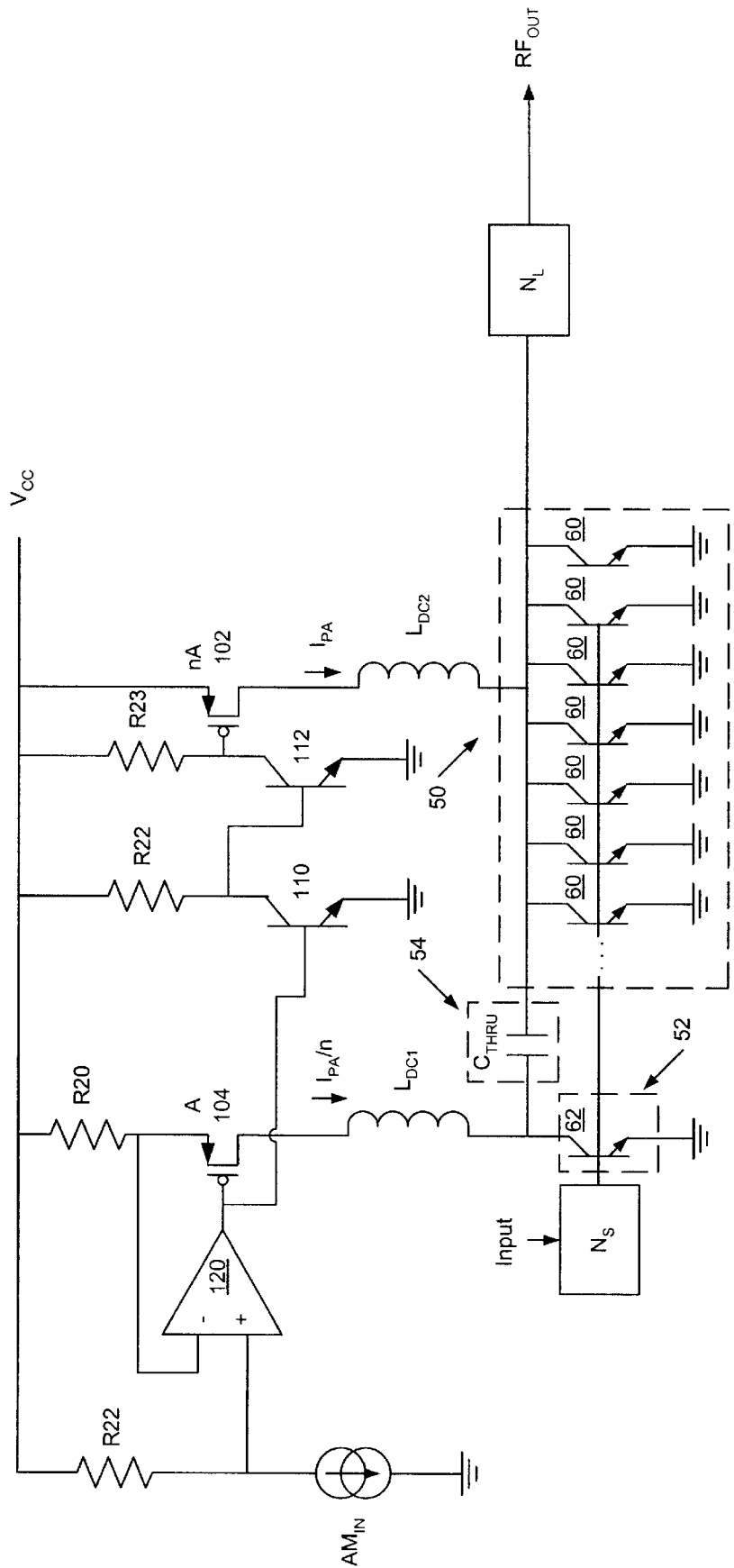
FIG. 6B is a schematic diagram illustrating a current modulation system such as illustrated in FIG. 6A.

FIG. 6B illustrates additional embodiments of the present invention, as illustrated in FIG. 6A, which provide AM restoration using current modulation with current detection and voltage buffering. As seen in FIG. 6B, the current provided to the transistor 62 is sensed through the resistor R20, which, for example, may be 10 ohms, and fed back to the comparator 120 which compares the voltage to the voltage across the resistor R22, which may, for example, be 20 ohms. The voltage across the resistor R22 is modulated by the current source $AM_{IN}$ and the results of the comparison provides the gate signal for the transistor 104 and the transistor 102. The gate signal provided to the transistor 102 is buffered by gain stages, such as that provided by the transistors 110 and 112 and the resistors R22 and R23, to drive the higher capacitance of the gate of the larger transistor 102 which may extend the modulation bandwidth. In the present example, the resistors R22 and R23 may each have a value of 200 ohms.

Figure 7A:
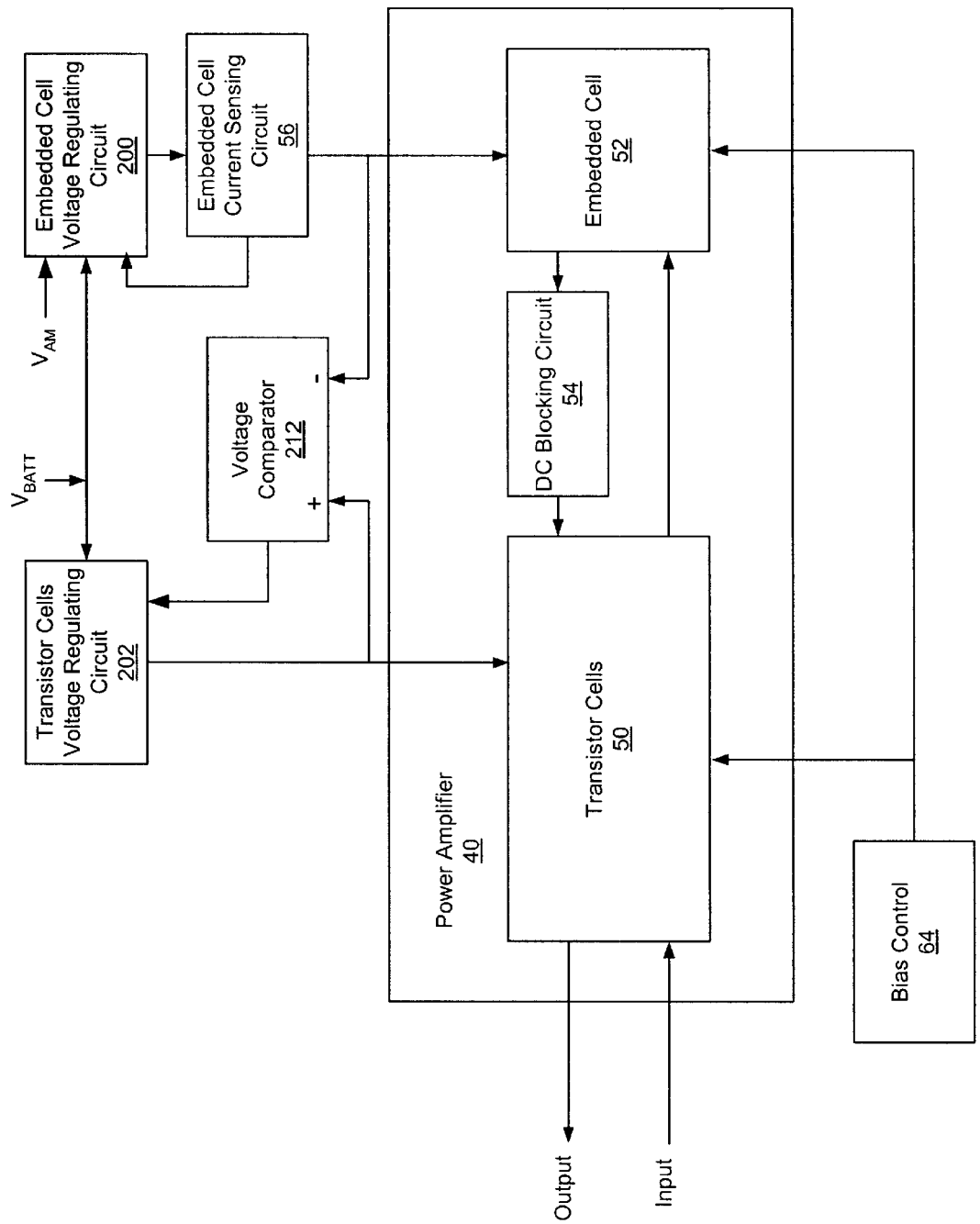
FIG. 7A is a block diagram illustrating further embodiments of a current modulation system according to embodiments of the present invention.

FIG. 7A illustrates a current modulation system utilizing the embedded cell 52 which also locks the supply voltages to the embedded cell 52 and the transistor cells 50. As seen in FIG. 7A an embedded cell voltage regulating circuit 200 provides power to the embedded cell 52 through an embedded cell current sensing circuit 56. The current supplied to the embedded cell 52 is sensed by the embedded cell current sensing circuit 56 and the sensed current is fed back to the embedded cell voltage regulating circuit 200 through a voltage buffer 210. The embedded cell voltage regulating circuit 200 modulates the voltage provided to the embedded cell 52 based on the input $V_{AM}$ and the feedback signal from the embedded cell current sensing circuit 56. A voltage comparator 212 compares the voltage of the embedded cell and the transistor cells 50 and provides a feedback signal to the transistor cells voltage regulating circuit 202 such that the voltage provided to the transistor cells 50 is locked to the voltage provided to the embedded cell 52 such that the transistor cells voltage regulating circuit modulates the voltage provided to the transistor cells 50 based on the voltage provided by the embedded cell voltage regulating circuit 200 to the embedded cell 52.

By current sensing using the embedded cell, and locking the sensed current to a specified $AM_{IN}$ input, the current of the embedded cell follows the desired input waveform. By then imposing that the rest of the power amplifier supply voltage follow that of the embedded cell, the current will be a scaled mirror of the current of the embedded cell. This occurs because the AC coupling enables the same impedance environment for all the identical transistor cells such that they draw the same current density for the same output voltage waveforms at RF and DC. In this way the entire envelope restoration may be achieved for bipolar saturated amplifiers based on current sensing, and done in a way which may enable integration, high accuracy resistor matching and maintain high efficiency.

Figure 7B:
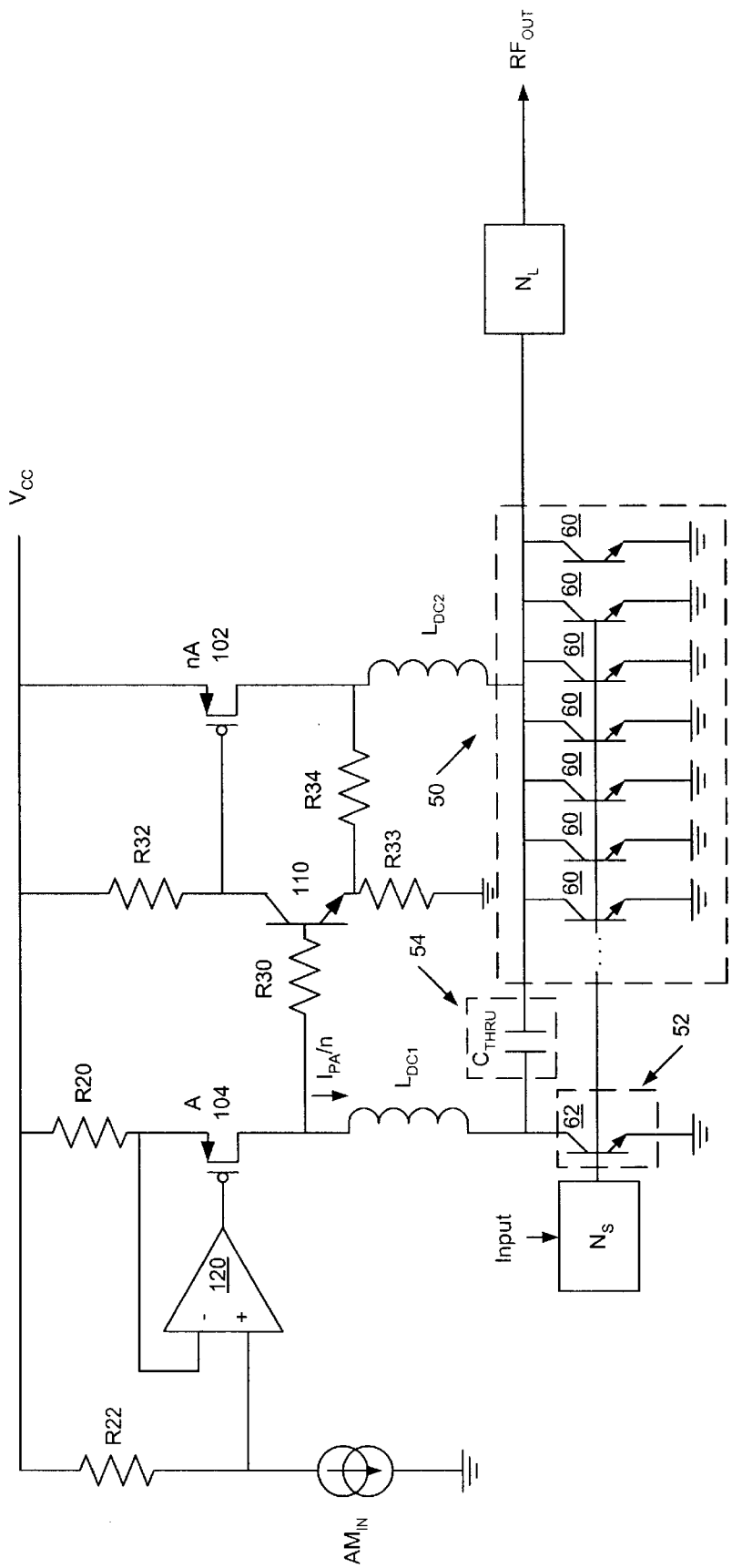
FIG. 7B is a schematic diagram illustrating a current modulation system such as illustrated in FIG. 7A.

FIG. 7B illustrates further embodiments of the present invention, as illustrated in FIG. 7A, which provide AM restoration using current modulation with current detection and a voltage control loop. As seen in FIG. 7B, the output voltage of the embedded cell 62 is used to drive the larger transistor 102. Thus, the transistor 100 is coupled to the transistor 104 through the resistor R30. The transistor 110 is in series with the resistors R32 and R33 and the output voltage of the transistor cells 50 is fed back to the transistor 110 through the resistor R34. In a particular example, the resistor R30 may have a value of 100 ohms, the resistor R32 a value of 1000 ohms, the resistor R33 a value of 100 ohms and the resistor R34 a value of 400 ohms.

Figure 7C:
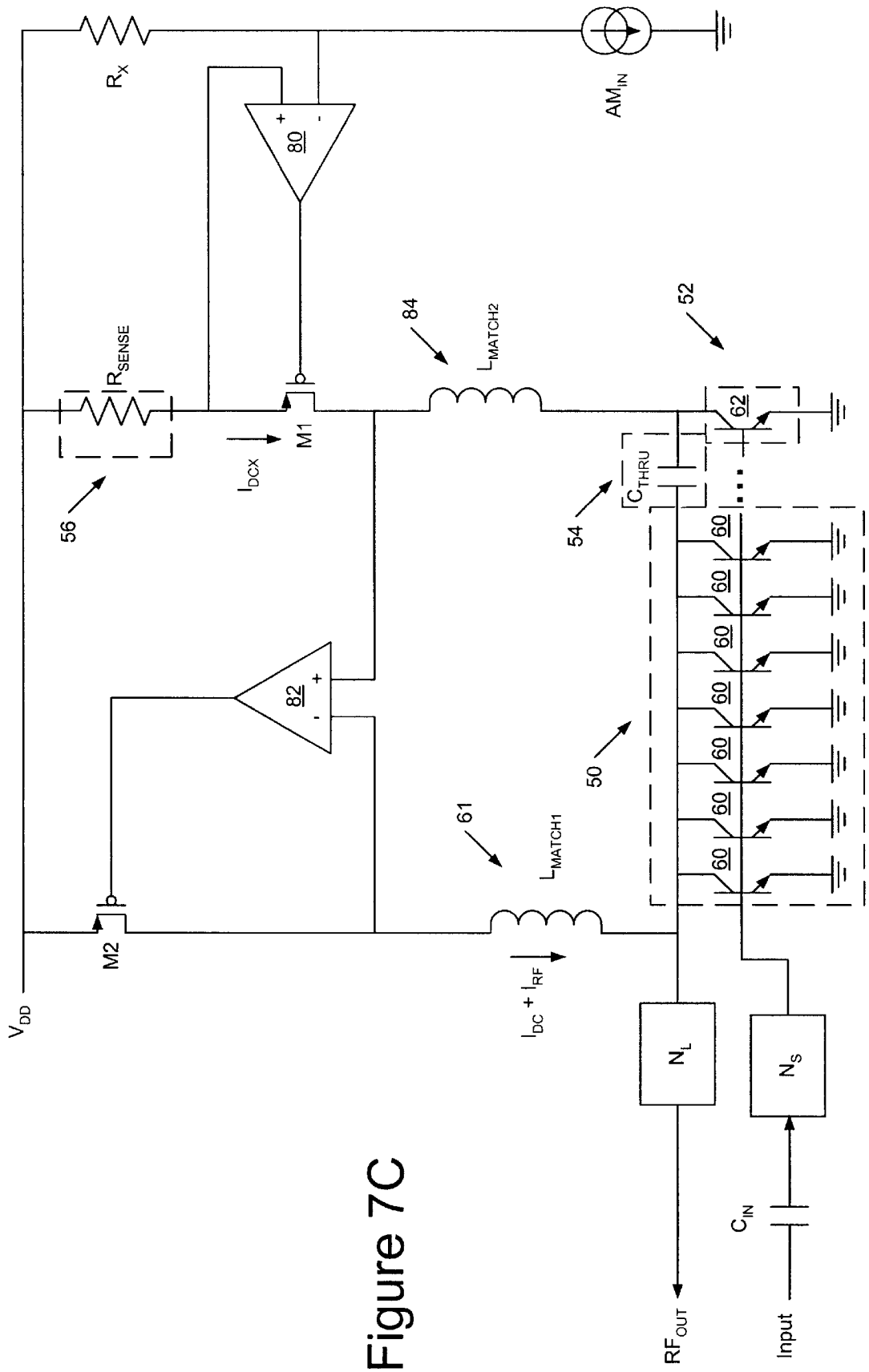
FIG. 7C is a schematic diagram illustrating further embodiments of a current modulation system such as illustrated in FIG. 7A.

FIG. 7C illustrates further embodiments of the present invention, as illustrated in FIG. 7A, for current modulation using current sensing and control. In particular, as seen in FIG. 7C, a current source is modulated by the input $AM_{IN}$. This, in turn, results in a voltage drop across the resistor $R_X$. A first operational amplifier 80 drives the pFET transistor M1 based on the sensed current through $R_{SENSE}$. Thus, the voltage across the resistor $R_{SENSE}$ is the same as the voltage drop across the resistor $R_X$ such that the current $I_{DCX}$ through the embedded cell 52 is locked to $AM_{IN}$. The current through the embedded cell 52 would, therefore, be given as follows:

$$I_{DCX} = AM_{IN} R_X / R_{SENSE}.$$

Through the integration of both $R_X$ and $R_{SENSE}$ this ratio may be assured. The second operational amplifier 82 and pFET transistor M2 act as a voltage follower such that the voltage applied to the transistor cells 50 is the same as that applied to the embedded cell 52. The inductor 84, having a value of $L_{MATCH2}$, and the inductor 61, having a value of $L_{MATCH1}$, may also be provided to match the power supply voltage applied to the embedded cell 52 to that of the transistor cells 50 and to assure that the output impedance environment is maintained to be the same for the embedded cell 52 as for the transistor cells 50.

Figure 8A:
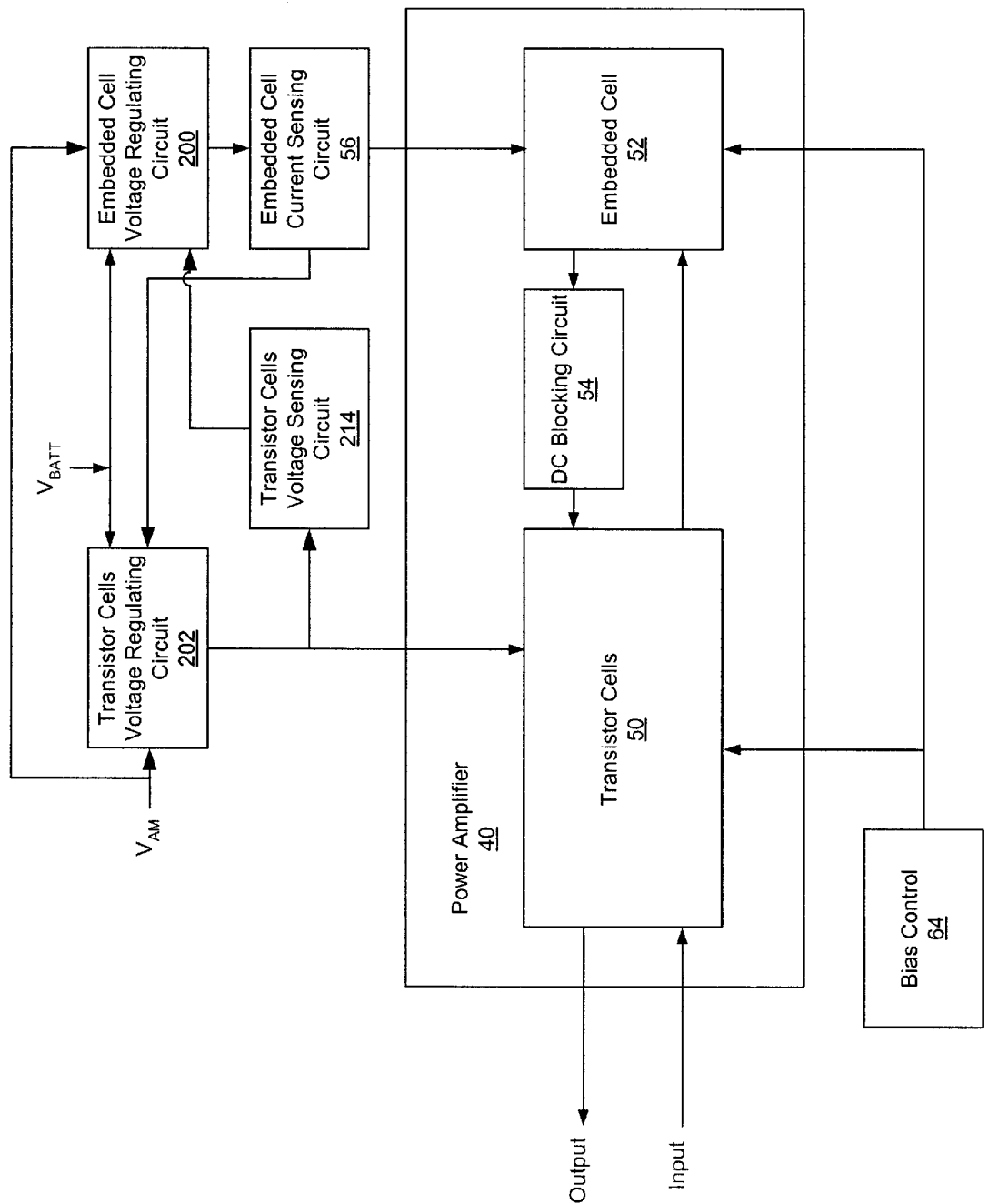
FIG. 8A is a block diagram illustrating embodiments of a modulation system utilizing current and voltage feedback according to embodiments of the present invention.

FIG. 8A illustrates a system utilizing current sensing of the embedded cell 52 and voltage sensing of the transistor cells 50. As seen in FIG. 8A an embedded cell voltage regulating circuit 200 provides power to the embedded cell 52 through an embedded cell current sensing circuit 56. The current supplied to the embedded cell 52 is sensed by the embedded cell current sensing circuit 56 and the sensed current is fed back to a transistor cells voltage regulating circuit 202. The transistors cell voltage regulating circuit 202 modulates the voltage provided to the transistor cells 50 based on the input $V_{AM}$ and the feedback signal from the embedded cell current sensing circuit 56. A transistor cells voltage sensing circuit 214 senses the voltage provided to the transistor cells 50 by the transistor cells voltage regulating circuit 202 and provides a feedback signal corresponding to the sensed voltage to the embedded cell voltage regulating circuit 200. The embedded cell voltage regulating circuit 200 modulates the voltage provided to the embedded cell 52 based on the feedback signal from the transistor cells voltage sense circuit 214 and the amplitude modulated input $V_{AM}$.

Figure 8B:
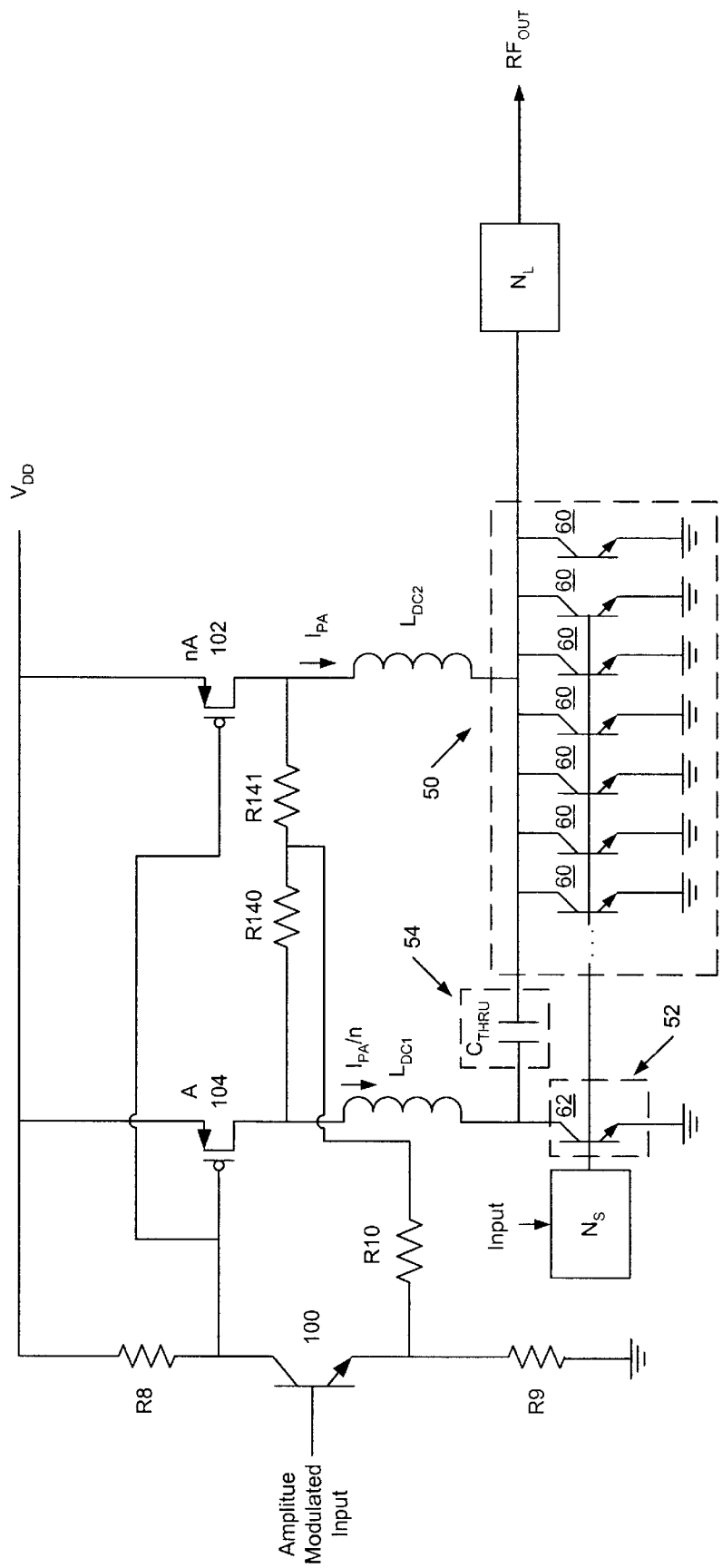
FIG. 8B is a schematic diagram illustrating a current and voltage feedback system such as illustrated in FIG. 8A.

FIG. 8B illustrates additional embodiments of the present invention, as illustrated in FIG. 8A, which utilize voltage and/or current modulation. As seen in FIG. 8B, the resistors R140 and R141 provide voltage feedback from the embedded cell 52 and the transistors 50. The resistors R140 and R141 may be sized either statically or dynamically to optimize feedback between the two different stages. Additional examples of the use of current and voltage modulation are provided in concurrently filed U.S. patent application Ser. No. 09/866,934, entitled "HIGH LEVEL MODULATION METHOD AND APPARATUS", the disclosure of which is incorporated herein as if set forth fully herein.

Figure 8C:
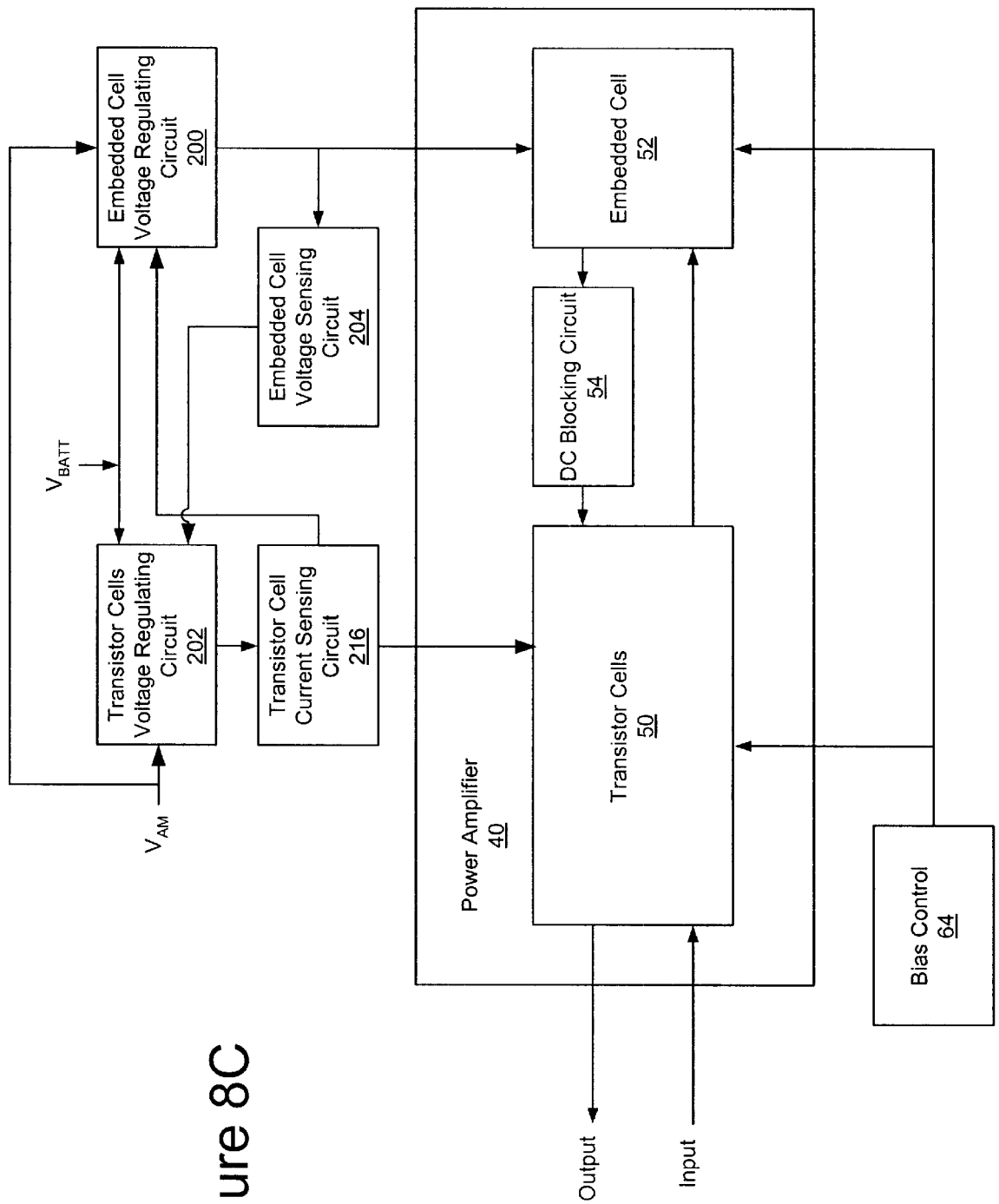
FIG. 8C is a block diagram illustrating further embodiments of a modulation system utilizing current and voltage feedback system.

FIG. 8C illustrates a system utilizing voltage sensing of the embedded cell 52 and current sensing of the transistor cells 50. As seen in FIG. 8C an embedded cell voltage regulating circuit 200 provides power to the embedded cell 52. The voltage supplied to the embedded cell 52 is sensed by the embedded cell voltage sensing circuit 204 and the sensed voltage is fed back to a transistor cells voltage regulating circuit 202. A transistor cells current sensing circuit 216 senses the current provided to the transistor cells 50 by the transistor cells voltage regulating circuit 202 and provides a feedback signal corresponding to the sensed current to the embedded cell voltage regulating circuit 200. The embedded cell voltage regulating circuit 200 modulates the voltage provided to the embedded cell 52 based on the feedback signal from the transistor cells current sensing circuit 216 and the amplitude modulated input $V_{AM}$.

While embodiments of the present invention has been described with reference to integrated devices, as will be appreciated by those of skill in the art, embodiments of the present invention may also be provided as discrete devices or combinations of discrete devices and integrated devices. For example, a "sense resistor" input could be provided for an integrated device which allows for the variation of the sense resistor value. Similarly, a "coupling" input and output could also be provided which would allow for different DC blocking circuits to be utilized.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. An amplifier comprising:
  a plurality of transistor cells, each cell having a controlling terminal and controlled terminals, wherein the controlling terminals of the plurality of transistor cells are commonly connected; and
  a DC blocking circuit which is configured to AC couple a controlled terminal of at least one of the plurality of transistor cells to a corresponding controlled terminal of at least one of the remainder of the plurality of transistor cells.

2. The amplifier of claim 1, further comprising a DC sensing circuit which is configured to provide a DC current to the controlled terminal of the at least one transistor cell.

3. The amplifier of claim 2, wherein the DC sensing circuit is configured to sense a direct current provided to the at least one transistor cell which is proportional to a DC current supplied to the remaining transistor cells in the plurality of transistor cells.

4. The amplifier of claim 2, wherein the DC sensing circuit comprises a resistor having a first terminal coupled to a first reference voltage and a second terminal coupled to the controlled terminal of the at least one transistor cell.

5. The amplifier of claim 4, wherein the DC sensing circuit further comprises:
  an inductor having a first terminal coupled to the controlled terminal of the at least one transistor, wherein the DC current is sensed by sensing a voltage between the first terminal of the resistor and the second terminal of the inductor.

6. The amplifier of claim 5, wherein the DC sensing circuit further comprises a capacitor having a first terminal coupled to the second terminal of the inductor and a second terminal coupled to a second reference voltage.

7. The amplifier of claim 5, wherein the inductor has a value sufficiently large so as to not substantially change the DC current supplied to the controlled terminal of the at least one transistor cell of the plurality of transistor cells.

8. The amplifier of claim 5, wherein the inductor has a value of from about 10 to about 100 nH.

9. The amplifier of claim 4, wherein the resistor has a value selected based on an expected DC current range so as to provide a voltage of sufficient magnitude to be sensed by a voltage sensing circuit for the expected DC current range.

10. The amplifier of claim 4, wherein the resistor has a value of from about 10 to about 100 ohms.

11. The amplifier of claim 4, wherein the resistor is integrated with the plurality of transistor cells in a single integrated circuit.

12. The amplifier of claim 2, wherein the DC sensing circuit is a current mirror which mirrors the DC current provided to the controlled terminal of the at least one transistor cell.

13. The amplifier of claim 12, wherein the capacitor is selected so as to have an impedance which is substantially less than an overall impedance of the corresponding controlled terminals of the remaining transistor cells in the plurality of transistor cells.

14. The amplifier of claim 2, further comprising a DC bias adjust circuit which controls a DC bias of the amplifier based on the sensed DC current of the DC sensing circuit.

15. The amplifier of claim 1, wherein the DC blocking circuit comprises a capacitor having a first terminal coupled to the controlled terminal of the at least one of the plurality of transistor cells and a second terminal coupled to the corresponding controlled terminal of the remaining transistor cells of the plurality of transistor cells.

16. The amplifier of claim 1, wherein dimensions of the at least one of the plurality of transistor cells are substantially the same as dimensions of remaining ones of the plurality of transistor cells.

17. The amplifier according to claim 1, wherein a first control voltage threshold associated with the at least one of the plurality of transistor cells is substantially the same as a second control voltage threshold associated with remaining ones of the plurality of transistor cells.

18. The amplifier according to claim 16, wherein dimensions of the at least one of the plurality of transistor cells are different from dimensions of remaining ones of the plurality of transistor cells.

19. The amplifier of claim 1, wherein the plurality of transistor cells comprise a transistor having a first common controlled terminal and a plurality of second controlled terminals and wherein the at least one of the plurality of transistor cells comprises at least one of the second controlled terminals.

20. The amplifier of claim 19, wherein the at least one of the second controlled terminals has substantially the same dimensions as dimensions of remaining ones of the controlled terminals.

21. The amplifier of claim 19, wherein the plurality of transistor cells further comprises a transistor having a common controlling terminal.

22. The amplifier of claim 1, wherein the amplifier comprises an amplifier in a wireless communications device.

23. The amplifier of claim 1, wherein the plurality of transistors comprise bipolar transistors.

24. The amplifier of claim 1, wherein the plurality of transistors comprise a multiple emitter bipolar transistor.

25. The amplifier of claim 1, wherein the plurality of transistors comprise field effect transistors.

26. The amplifier of claim 1, wherein the plurality of transistors comprise a multiple drain field effect transistor.

27. The amplifier of claim 1 in combination with an amplitude modulation circuit utilizing voltage modulation with voltage feedback.

28. The amplifier of claim 27, wherein the amplitude modulation circuit comprises:
    an embedded cell voltage sensing circuit configured to sense a voltage provided to the at least one of the plurality of transistor cells and provide a voltage feedback signal;
    an embedded cell voltage regulating circuit configured to modulate the voltage to the at least one of the plurality of transistor cells based on an amplitude modulation input signal and the voltage feedback signal; and
    a transistor cells voltage regulating circuit configured to modulate a voltage provided to remaining ones of the plurality of transistor cells based on the amplitude modulation input signal and the voltage feedback signal.

29. The amplifier of claim 1 in combination with an amplitude modulation circuit utilizing voltage modulation with sensed current feedback.

30. The amplifier of claim 29, wherein the amplitude modulation circuit comprises:
    an embedded cell current sensing circuit configured to sense a current provided to the at least one of the plurality of transistor cells and provide a current feedback signal;
    a voltage regulating circuit configured to modulate a voltage provided to the at least one of the plurality of transistor cells and remaining ones of the plurality of transistor cells based on the amplitude modulation input signal and the current feedback signal.

31. The amplifier of claim 1 in combination with an amplitude modulation circuit utilizing current modulation with current detection and voltage buffering.

32. The amplifier of claim 31, wherein the amplitude modulation circuit comprises:
    an embedded cell current sensing circuit configured to sense a current provided to the at least one of the plurality of transistor cells and provide a current feedback signal;
    an embedded cell voltage regulating circuit configured to modulate the voltage to the at least one of the plurality of transistor cells based on an amplitude modulation input signal and the current feedback signal;
    a voltage buffer circuit configured to receive the current feedback signal and provide a buffered feedback signal; and
    a transistor cells voltage regulating circuit configured to modulate a voltage provided to remaining ones of the plurality of transistor cells based on the buffered feedback signal.

33. The amplifier of claim 1 in combination with an amplitude modulation circuit utilizing current modulation with current detection and a voltage control loop.

34. The amplifier of claim 33, wherein the amplitude modulation circuit comprises:
    an embedded cell current sensing circuit configured to sense a current provided to the at least one of the plurality of transistor cells and provide a current feedback signal;

an embedded cell voltage regulating circuit configured to modulate the voltage to the at least one of the plurality of transistor cells based on an amplitude modulation input signal and the current feedback signal;

a voltage comparator configured to compare a voltage provided to the at least one of the plurality of transistor cells and a voltage provided to remaining ones of the plurality of transistor cells and provide a comparison output; and a transistor cells voltage regulating circuit configured to provide the voltage to remaining ones of the plurality of transistor cells based on the comparison output.

35. The amplifier of claim 1 in combination with an amplitude modulation circuit utilizing current and voltage modulation.

36. The amplifier of claim 35, wherein the amplitude modulation circuit comprises:

an embedded cell current sensing circuit configured to sense a current provided to the at least one of the plurality of transistor cells and provide a current feedback signal;

a transistor cells voltage sensing circuit configured to sense a voltage provided to remaining ones of the plurality of transistor cells and provide a voltage feedback signal;

an embedded cell voltage regulating circuit configured to modulate a voltage provided to the at least one of the plurality of transistor cells based on an amplitude modulation input signal and the voltage feedback signal; and a transistor cells voltage regulating circuit configured to modulate the voltage provided to remaining ones of the plurality of transistor cells based on the amplitude modulated input and the current feedback signal.

37. The amplifier of claim 35, wherein the amplitude modulation circuit comprises:

an embedded cell voltage sensing circuit configured to sense a voltage provided to the at least one of the plurality of transistor cells and provide a voltage feedback signal;

a transistor cells current sensing circuit configured to sense a current provided to remaining ones of the plurality of transistor cells and provide a current feedback signal;

an embedded cell voltage regulating circuit configured to modulate the voltage provided to the at least one of the plurality of transistor cells based on an amplitude modulation input signal and the current feedback signal; and a transistor cells voltage regulating circuit configured to modulate a voltage provided to remaining ones of the plurality of transistor cells based on the amplitude modulated input and the voltage feedback signal.

38. The amplifier of claim 1 in combination with an amplitude modulation circuit utilizing current modulation.

39. The amplifier of claim 1 in combination with an amplitude modulation circuit utilizing voltage modulation.

40. A method of sensing a direct current bias in an amplifier having a plurality of transistor cells, comprising:

causing alternating current to flow between a controlled terminal of at least one of the transistor cells and controlled terminals of other transistor cells in the plurality of transistor cells while blocking DC current flow between the controlled terminal of the at least one of the transistor cells and the controlled terminals of the other transistor cells; and sensing a direct current supplied to the at least one of the transistor cells.

41. The method of claim 40, wherein the sensing the DC current supplied to the at least one of the transistor cells comprises measuring a voltage value across a resistor in series with a supply voltage provided to the controlled terminal of the at least one of the transistor cells.

42. The method of claim 40, wherein the causing alternating current to flow between the controlled terminal of the at least one of the transistor cells and the controlled terminals of other transistor cells in the plurality of transistor cells while blocking DC current flow between the controlled terminal of the at least one of the transistor cells and the controlled terminals of the other transistor cells comprises capacitively coupling the controlled terminal of at least one of the transistor cells to the controlled terminals of the other transistor cells.

43. The method of claim 40, further comprising adjusting a direct current bias of the amplifier based on the sensed DC current supplied to the at least one of the transistor cells.

44. The method of claim 43, wherein the adjusting a direct current bias of the amplifier based on the sensed DC current supplied to the at least one of the transistor cells further comprises determining a total current based on a ratio of a total number of transistor cells in the plurality of transistor cells to a number of transistor cells which are coupled to the controlled terminals of the other transistor cells so as to determine a total direct current supplied to the amplifier.

45. A system for sensing a direct current bias in an amplifier having a plurality of transistor cells, comprising:

a coupling circuit configured to cause AC current to flow between a controlled terminal of at least one of the transistor cells and controlled terminals of other transistor cells in the plurality of transistor cells while blocking DC current flow between the controlled terminal of the at least one of the transistor cells and the controlled terminals of the other transistor cells; and a sensing circuit configured to sense a DC current supplied to the at least one of the transistor cells.

46. The system of claim 45, wherein the sensing circuit comprises a resistor in series with a supply voltage provided to the controlled terminal of the at least one of the transistor cells.

47. The system of claim 46, wherein the sensing circuit further comprises means for measuring a voltage across the resistor.

48. The system of claim 45, wherein the coupling circuit comprises a capacitive coupling circuit configured to couple the controlled terminal of at least one of the transistor cells to the controlled terminals of the other transistor cells.

49. The system of claim 48, wherein the capacitive coupling circuit comprises a capacitor having a first terminal coupled to the controlled terminal of at least one of the transistor cells and a second terminal coupled to the controlled terminals of the other transistor cells.

50. The system of claim 45, further comprising a bias adjust circuit configured to adjust a direct current bias of the amplifier based on the sensed direct current supplied to the at least one of the transistor cells.

51. The system of claim 50, wherein the bias adjust circuit is further configured to determine a total current based on a ratio of a total number of transistor cells in the plurality of transistor cells to a number of transistor cells which are coupled to the controlled terminals of the other transistor cells so as to determine a total DC current supplied to the amplifier.

52. A system for sensing a direct current bias in an amplifier having a plurality of transistor cells, comprising:

means for causing AC current to flow between a controlled terminal of at least one of the transistor cells and controlled terminals of other transistor cells in the plurality of transistor cells and while blocking DC current flow between the controlled terminal of the at least one of the transistor cells and the controlled terminals of the other transistor cells; and means for sensing a DC current supplied to the at least one of the transistor cells.

53. The system of claim 52, wherein the means for sensing comprises a resistor in series with a supply voltage provided to the controlled terminal of the at least one of the transistor cells.

54. The system of claim 53, wherein the means for sensing further comprises means for measuring a voltage across the resistor.

55. The system of claim 52, wherein the means for causing comprises means for capacitively coupling the controlled terminal of at least one of the transistor cells to the controlled terminals of the other transistor cells.

56. The system of claim 55, wherein the means for capacitively coupling comprises a capacitor having a first terminal coupled to the controlled terminal of at least one of the transistor cells and a second terminal coupled to the controlled terminals of the other transistor cells.

* * * * *